(12) United States Patent
Zhai et al.

(10) Patent No.: US 9,589,936 B2
(45) Date of Patent: Mar. 7, 2017

(54) 3D INTEGRATION OF FANOUT WAFER LEVEL PACKAGES

(71) Applicant: Apple Inc., Cupertino, CA (US)

(72) Inventors: Jun Zhai, Cupertino, CA (US); Kunzhong Hu, Cupertino, CA (US); Flynn P. Carson, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 37 days.

(21) Appl. No.: 14/619,002

(22) Filed: Feb. 10, 2015

(65) Prior Publication Data
US 2016/0148904 A1    May 26, 2016

Related U.S. Application Data

(60) Provisional application No. 62/082,557, filed on Nov. 20, 2014.

(51) Int. Cl.
*H01L 25/065* (2006.01)
*H01L 21/48* (2006.01)
(Continued)

(52) U.S. Cl.
CPC ...... *H01L 25/0657* (2013.01); *H01L 21/4853* (2013.01); *H01L 21/561* (2013.01); *H01L 21/565* (2013.01); *H01L 21/568* (2013.01); *H01L 23/3135* (2013.01); *H01L 23/49811* (2013.01); *H01L 23/49838* (2013.01);
(Continued)

(58) Field of Classification Search
CPC ..................................................... H01L 24/89
See application file for complete search history.

(56) References Cited

U.S. PATENT DOCUMENTS

| | | | | |
|---|---|---|---|---|
| 5,744,827 | A | * | 4/1998 | Jeong ................. H01L 23/4951 257/673 |
| 6,468,831 | B2 | * | 10/2002 | Leong ................. H01L 21/563 228/180.22 |

(Continued)

FOREIGN PATENT DOCUMENTS

DE    10 2013 101192 A1    3/2014

OTHER PUBLICATIONS

PCT International Search Report and Written Opinion for International Application No. PCT/US2015/058474, mailed Feb. 5, 2016, 13 pages.

*Primary Examiner* — Lex Malsawma
(74) *Attorney, Agent, or Firm* — Blakely, Sokoloff, Taylor & Zafman LLP

(57) ABSTRACT

Fanout wafer level packages (FOWLPs) and methods of formation are described. In an embodiment, a package includes a first routing layer, a first die on a top side of the first routing layer, and a first molding compound encapsulating the first die on the first routing layer. A first plurality of conductive pillars extends from a bottom side of the first routing layer. A second die is on a top side of a second routing layer, and the first plurality of conductive pillars is on the top side of the routing layer. A second molding compound encapsulates the first molding compound, the first routing layer, the first plurality of conductive pillars, and the second die on the second routing layer. In an embodiment, a plurality of conductive bumps (e.g. solder balls) extends from a bottom side of the second routing layer.

20 Claims, 25 Drawing Sheets

(51) Int. Cl.
  *H01L 21/56* (2006.01)
  *H01L 23/31* (2006.01)
  *H01L 23/498* (2006.01)
  *H01L 23/00* (2006.01)
  *H01L 25/00* (2006.01)
  *H01L 23/552* (2006.01)
  *H01L 25/03* (2006.01)
  *H01L 23/525* (2006.01)

(52) U.S. Cl.
  CPC .......... *H01L 23/525* (2013.01); *H01L 23/552* (2013.01); *H01L 24/19* (2013.01); *H01L 24/89* (2013.01); *H01L 24/96* (2013.01); *H01L 24/97* (2013.01); *H01L 25/03* (2013.01); *H01L 25/50* (2013.01); *H01L 2224/04105* (2013.01); *H01L 2224/12105* (2013.01); *H01L 2224/16227* (2013.01); *H01L 2224/73204* (2013.01); *H01L 2224/80001* (2013.01); *H01L 2224/97* (2013.01); *H01L 2225/0652* (2013.01); *H01L 2225/06572* (2013.01); *H01L 2924/15311* (2013.01); *H01L 2924/18161* (2013.01); *H01L 2924/18162* (2013.01); *H01L 2924/19105* (2013.01)

(56) References Cited

U.S. PATENT DOCUMENTS

| | | | |
|---|---|---|---|
| 7,365,416 B2* | 4/2008 | Kawabata | H01L 21/486 257/686 |
| 7,656,031 B2 | 2/2010 | Chen et al. | |
| 8,354,297 B2* | 1/2013 | Pagaila | H01L 25/16 257/678 |
| 8,796,139 B2 | 8/2014 | Ramasamy et al. | |
| 8,823,158 B2 | 9/2014 | Oh et al. | |
| 2006/0231939 A1* | 10/2006 | Kawabata | H01L 23/5385 257/686 |
| 2007/0057358 A1* | 3/2007 | Satou | H01L 25/0657 257/686 |
| 2011/0068444 A1* | 3/2011 | Chi | H01L 21/6835 257/669 |
| 2012/0056329 A1 | 3/2012 | Pagaila et al. | |
| 2013/0341784 A1* | 12/2013 | Lin | H01L 24/19 257/737 |
| 2014/0103527 A1* | 4/2014 | Marimuthu | H01L 23/3121 257/737 |
| 2014/0124955 A1* | 5/2014 | Chen | H01L 25/105 257/777 |
| 2016/0071818 A1* | 3/2016 | Wang | H01L 25/0655 257/774 |

* cited by examiner

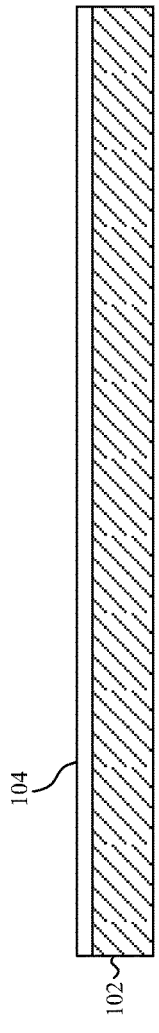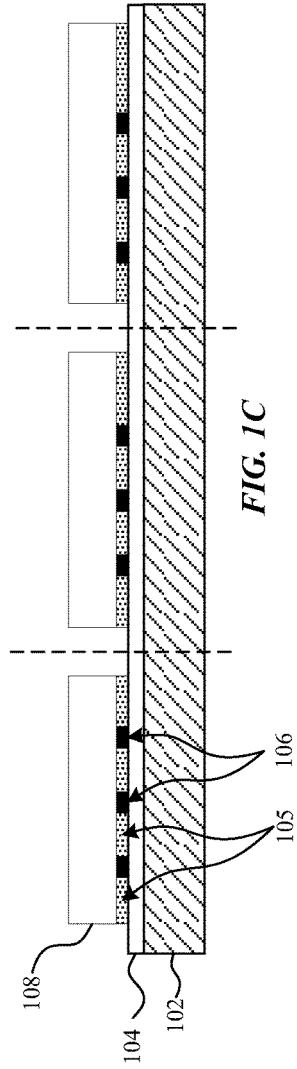

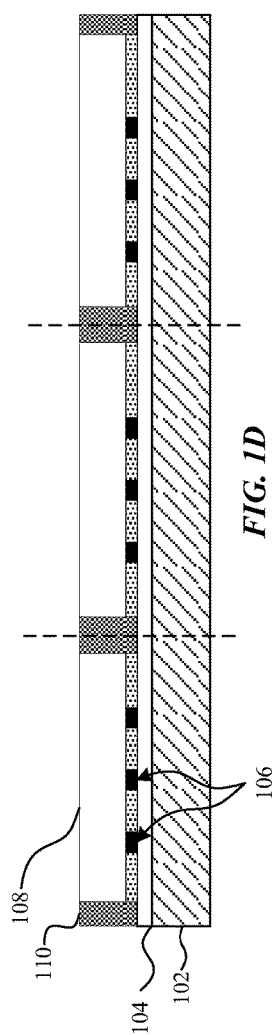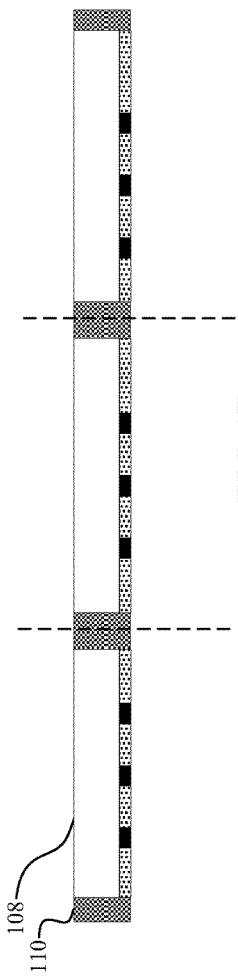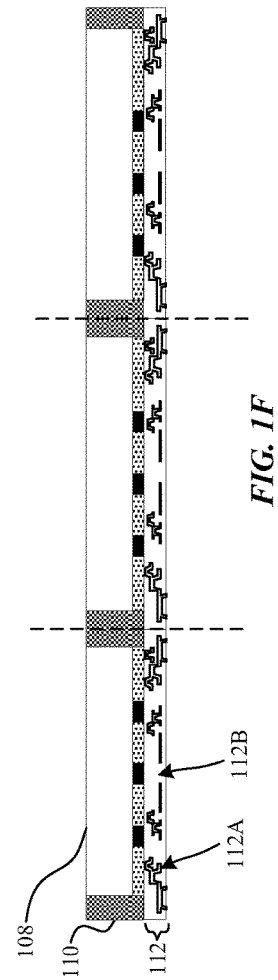

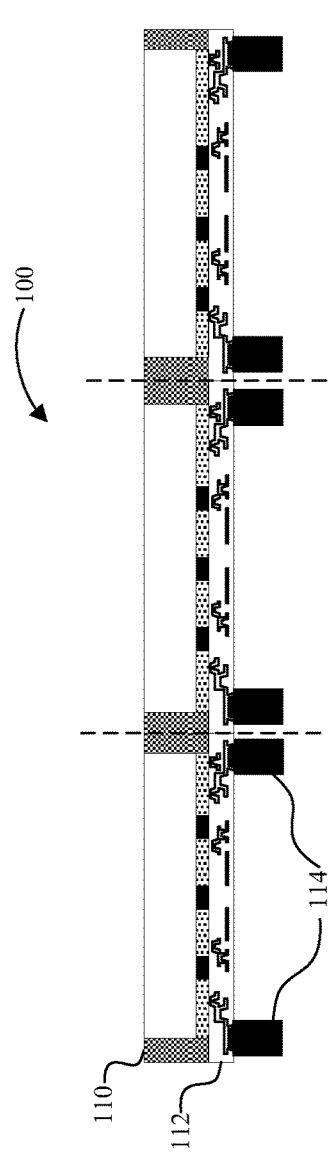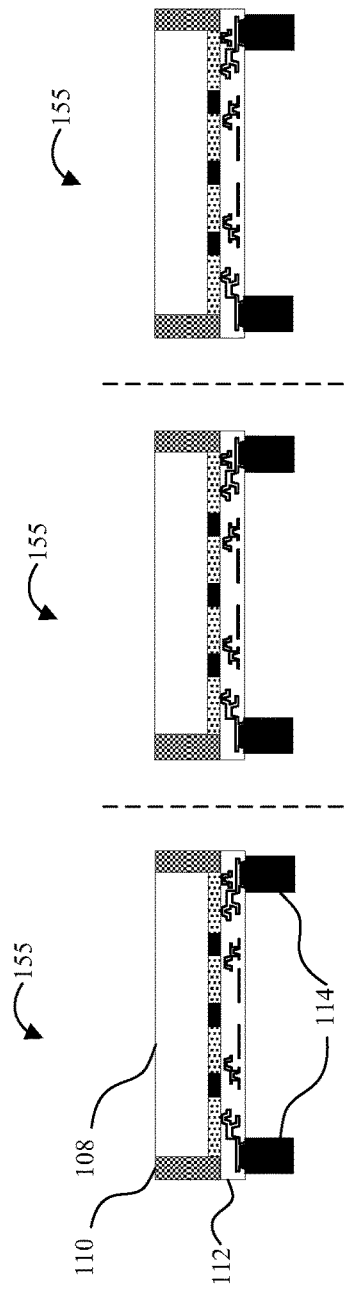

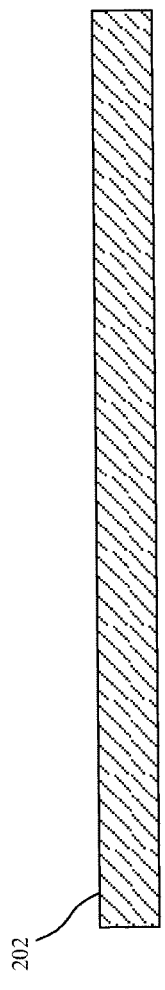
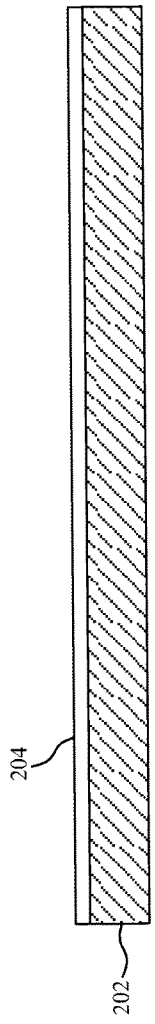
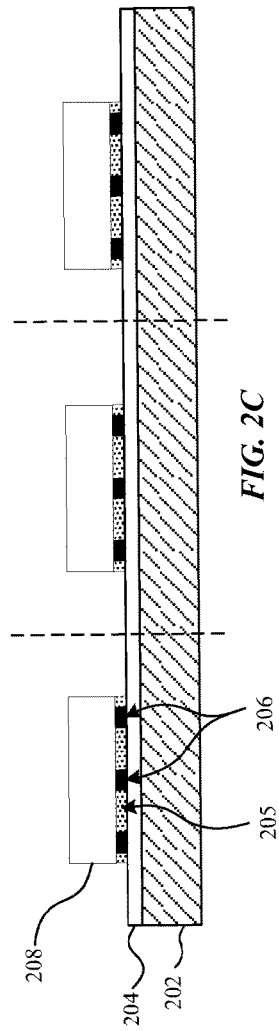
FIG. 2A
FIG. 2B
FIG. 2C

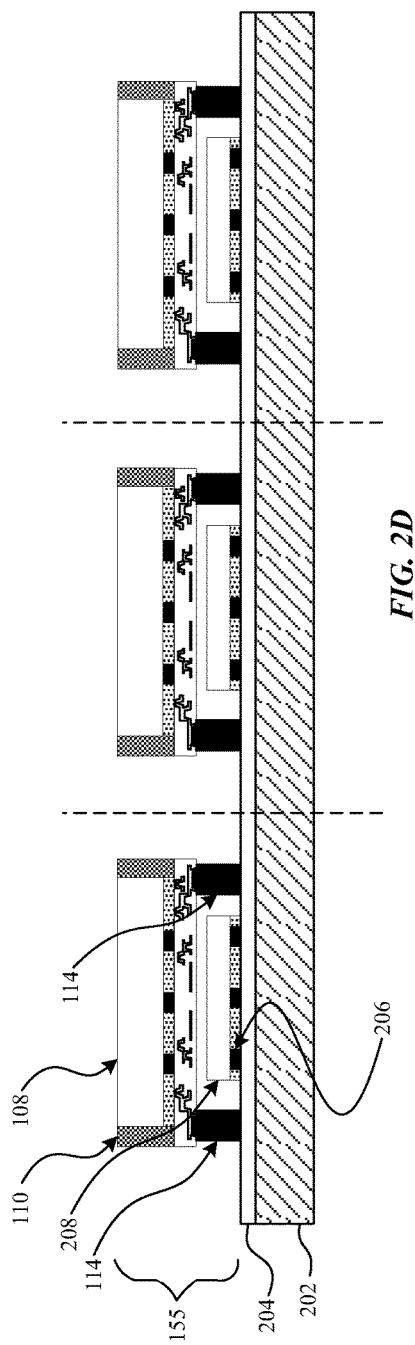
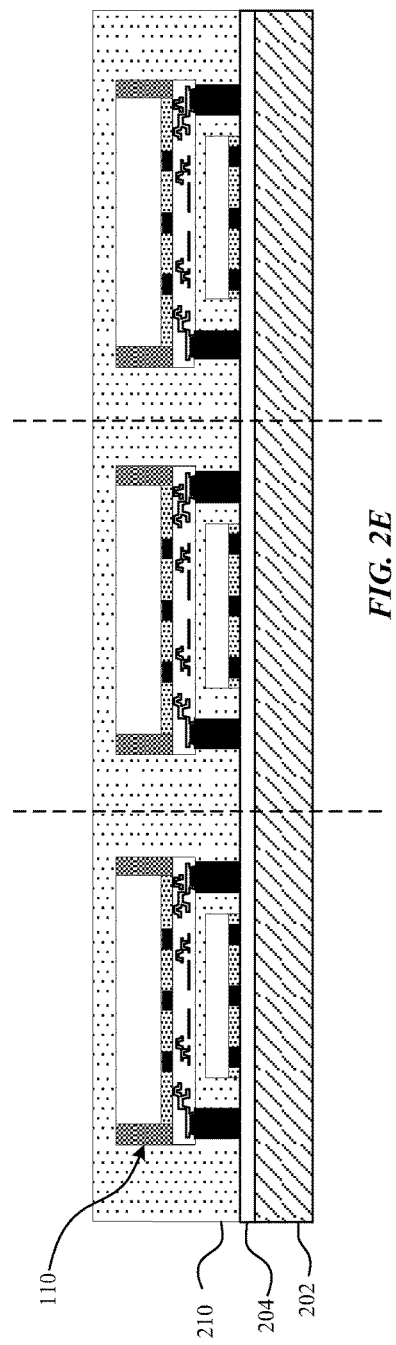
FIG. 2D
FIG. 2E

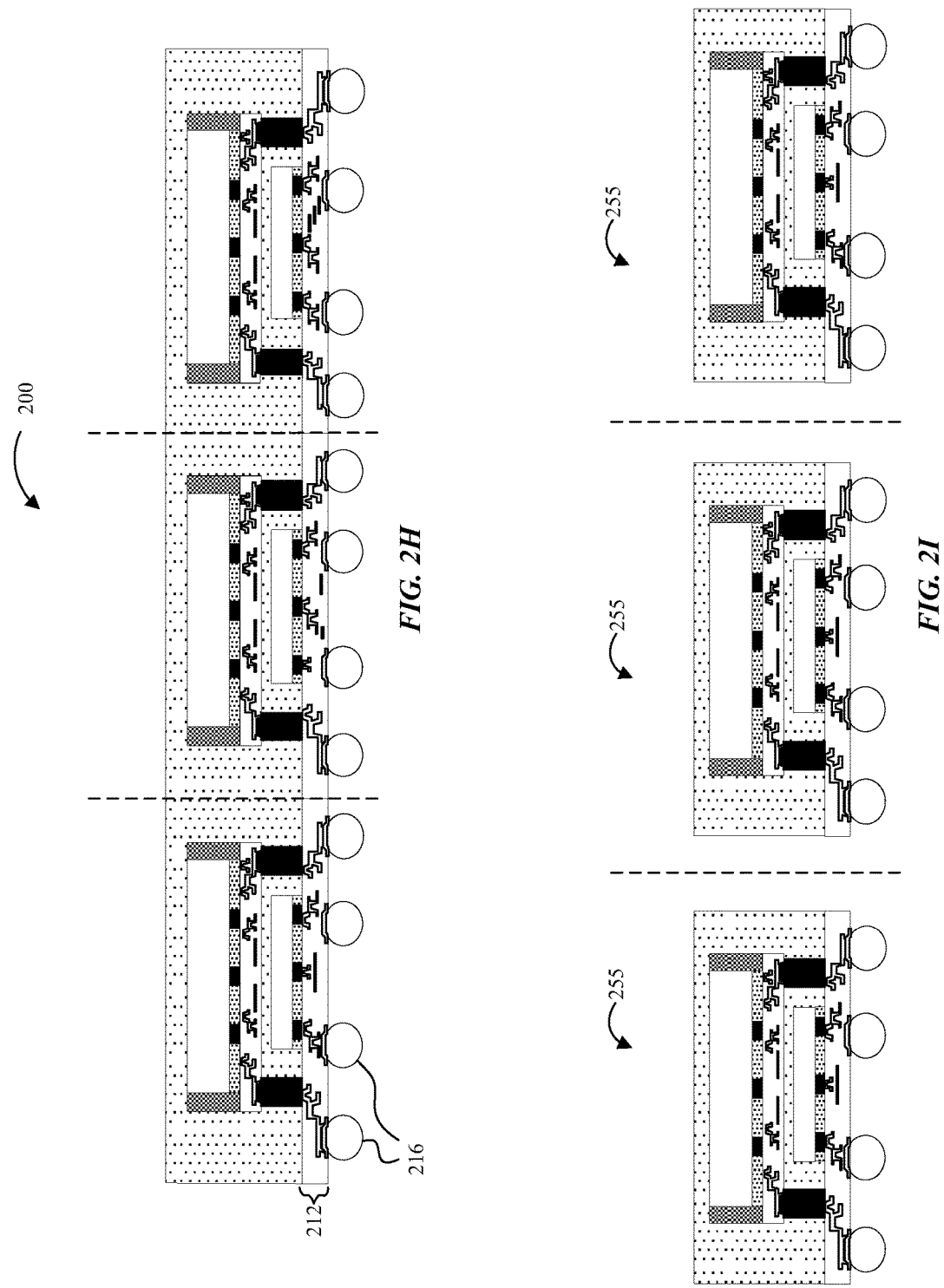

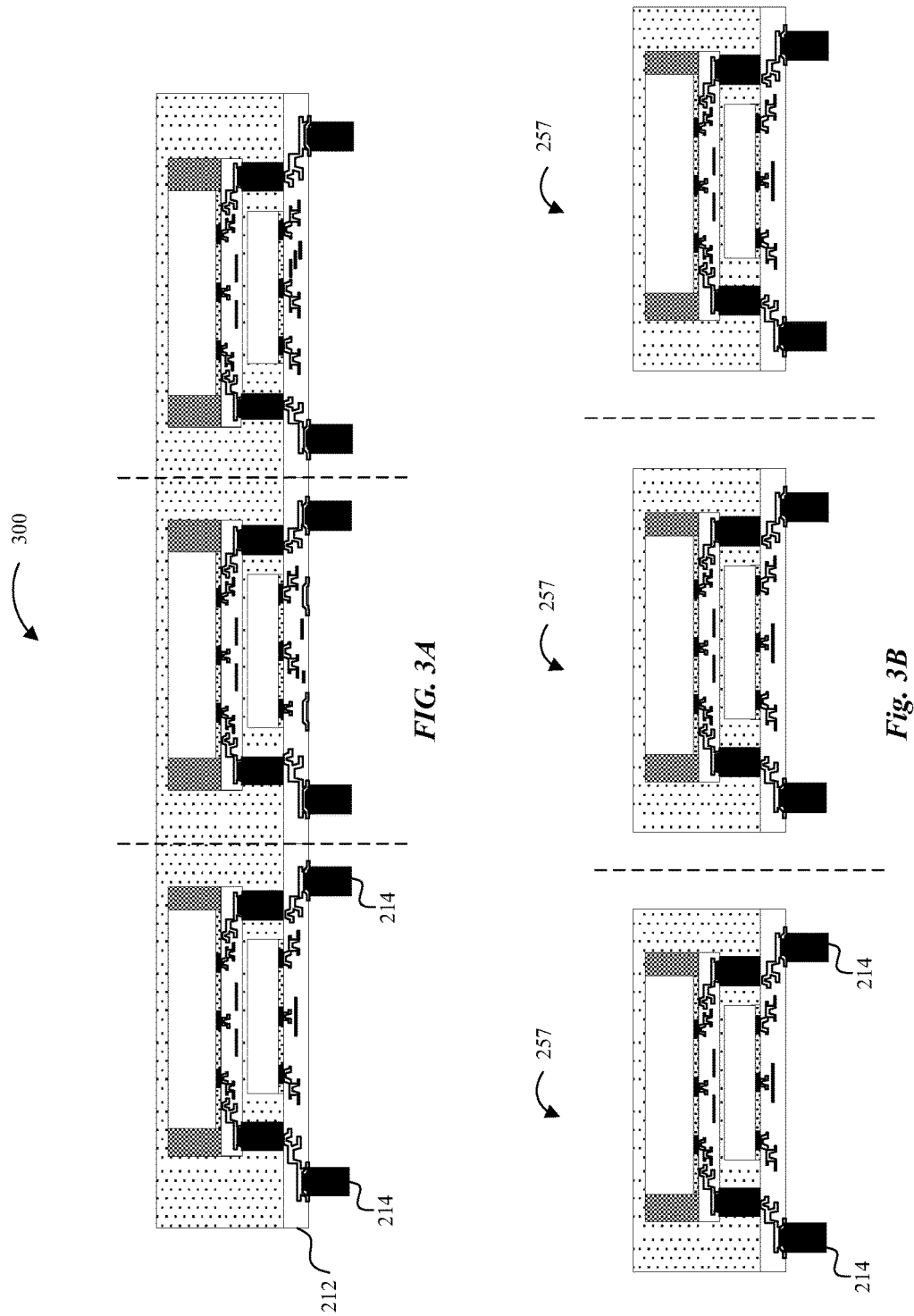

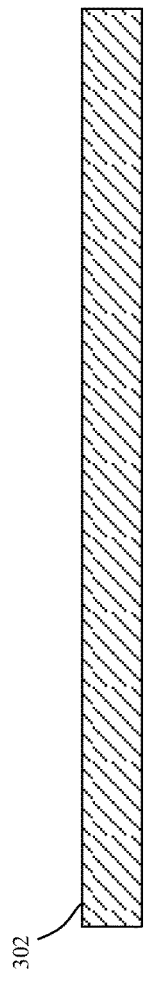
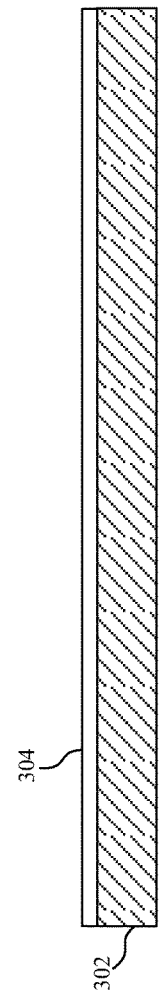
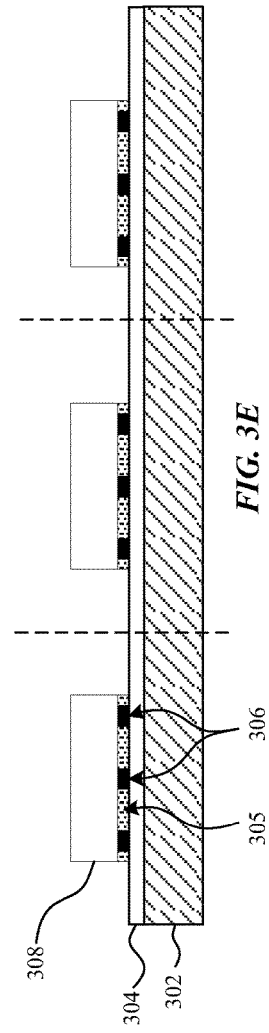
FIG. 3C
FIG. 3D
FIG. 3E

3D INTEGRATION OF FANOUT WAFER LEVEL PACKAGES

RELATED APPLICATIONS

This application claims the benefit of priority from U.S. Provisional Patent Application Ser. No. 62/082,557 filed on Nov. 20, 2014, the full disclosure of which is incorporated herein by reference.

BACKGROUND

Field

Embodiments described herein relate to semiconductor packaging. More particularly embodiments relate to fan-out wafer level packages and methods of fabrication.

Background Information

Packaging technologies for integrated circuits such as embedded wafer level ball grid array generally involve encapsulating an integrated circuit (IC) die in encapsulation material and then building wafer redistribution layer. The molding compound creates a fanout area that creates more space for a higher I/O count.

Pressures from advances in packaging technologies are leading to IC die with higher I/O count. In addition, the shrinking sizes of electronic devices and performance requirement are creating challenges for IC die packaging that has resulted in package on package (PoP) applications. There is an increased need for PoP applications that result in packages with higher I/O counts and smaller sizes for use in size-sensitive applications.

SUMMARY

Fanout wafer level packages (FOWLPs) and methods of formation are described. In an embodiment, a first FOWLP package includes a first routing layer, a first die on a top side of the first routing layer, a first molding compound encapsulating the first die on the first routing layer, and a first plurality of conductive pillars that extends from a bottom side of the first routing layer. The first plurality of conductive pillars and a second die may be secured on a top side of a second routing layer with a second molding compound that encapsulates the first molding compound, the first routing layer, the first plurality of conductive pillars, and the second die on the second routing layer. In this way, a second FOWLP that includes the first FOWLP is formed. Thus, a FOWLP in FOWLP is formed. In accordance with some embodiments, either or both of the first and second routing layers are redistribution layers (RDLs). For example, a redistribution line in the first RDL can be bonded to a contact pad on the first die. A redistribution line in the second RDL may be bonded to a contact pad on the second die as well as the first plurality of conductive pillars.

In some embodiments, the first molding compound that encapsulates the first die on the first routing layer does not cover the top side of the first die. For example, the first molding compound only encases the lateral sides of the first die without encasing the top side. In an embodiment, the second molding compound that encapsulates the first molding compound, the first routing layer, the first plurality of conductive pillars, and the second die on the second routing layer covers the top side of the first die. In an embodiment, the second molding compound does not cover the top side of the first die. The amount and height of the first and second molding compounds used in the second FOWLP can be varied to enable formation of FOWLPs with predetermined or specified z-heights.

In an embodiment, the first die is directly over the second die. In an embodiment, multiple active components, passive components and/or die are included in the packages. In one example, at least one passive component is included in the packages. In one example, a plurality of first die may be on the top side of the first routing layer and encapsulated by the first molding compound. A plurality of second die may be on the top side of the second routing layer and encapsulated by the second molding compound. In one example, at least one passive component is on the top side of the second routing layer in a location that is adjacent to at least one of the conductive pillars and is encapsulated by the second molding compound. In a further embodiment, the at least one passive component is outside the periphery of the conductive pillars. In accordance with one or more embodiments, the conductive pillars of the first plurality of conductive pillars are taller than the one or more second die. Accordingly, the height of the conductive pillars, thickness of routing layers, and height of the molding compounds contribute to the overall z-height of the package.

In one embodiment, the second FOWLP includes conductive bumps on a bottom side of the second routing layer. For example, the conductive bumps may be solder balls for bonding to another substrate such as a printed circuit board. Alternatively, the second FOWLP is already bonded to another substrate, and the conductive bumps are reflowed solder joints. The second FOWLP may additionally be prepared for or integrated into another package. In an embodiment, a second plurality of conductive pillars extends from a bottom side of the second routing layer. A third die and the second plurality of conductive pillars may be secured on a third routing layer, and a third molding compound may encapsulate the third die and the second FOWLP on the third routing layer. For example, the third molding compound may encapsulate the second molding compound, the second routing layer, the second plurality of conductive pillars, and the third die on the third routing layer. In an embodiment, a plurality of conductive bumps is on a bottom side of the third routing layer.

In an embodiment, a method of forming a package includes transferring a second die onto an adhesive layer, transferring a first plurality of conductive pillars of a first package onto the adhesive layer, and encapsulating the second die and the first package in a second molding compound. For some embodiments of the method, the first package includes a first routing layer, a first die on a top side of the first routing layer, a first molding compound encapsulating the first die on the first routing layer. In an embodiment, the first package is a FOWLP formed by transferring the first die to a first adhesive layer, encapsulating the first die with the first molding compound on the first adhesive layer, removing the first adhesive layer, and forming the first routing layer on the first die and the first molding compound, and plating the plurality of conductive pillars on the bottom side of the first routing layer.

In one embodiment, after the second die and the first package are encapsulated in the second molding compound, the adhesive layer is removed and a second routing layer is formed on the second die, the first plurality of conductive pillars, and the second molding compound. In an embodiment, conductive bumps can be placed on a bottom side of the second routing layer. In an embodiment, a second plurality of conductive pillars is plated on the bottom side of the second routing layer.

In another embodiment, the method further includes transferring a third die onto a second adhesive layer, transferring the second plurality of conductive pillars onto the second adhesive layer, and encapsulating the third die, the second plurality of conductive pillars, the second routing layer, and the second molding compound in a third molding compound. The second adhesive layer, may then be removed and third routing layer formed on the third die, the second plurality of conductive pillars, and the third molding compound. A plurality of conductive bumps may be formed on the third routing layer or a third plurality of conductive pillars may be plated to the third routing layer to continue forming additional FOWLPs in FOWLP.

BRIEF DESCRIPTION OF THE DRAWINGS

Embodiments described herein are illustrated by way of example and not limitation in the figures of the accompanying drawings, in which like references indicate similar features.

FIGS. 1A-1H are cross-sectional side view illustrations of a method of forming a first fan-out wafer level package (FOWLP) in accordance with an embodiment.

FIGS. 2A-2I are cross-sectional side view illustrations of a method of forming a second FOWLP in accordance with an embodiment.

FIGS. 3A-3J are cross-sectional side view illustrations of a method of forming a third FOWLP in accordance with an embodiment.

DETAILED DESCRIPTION

Figure 1I:
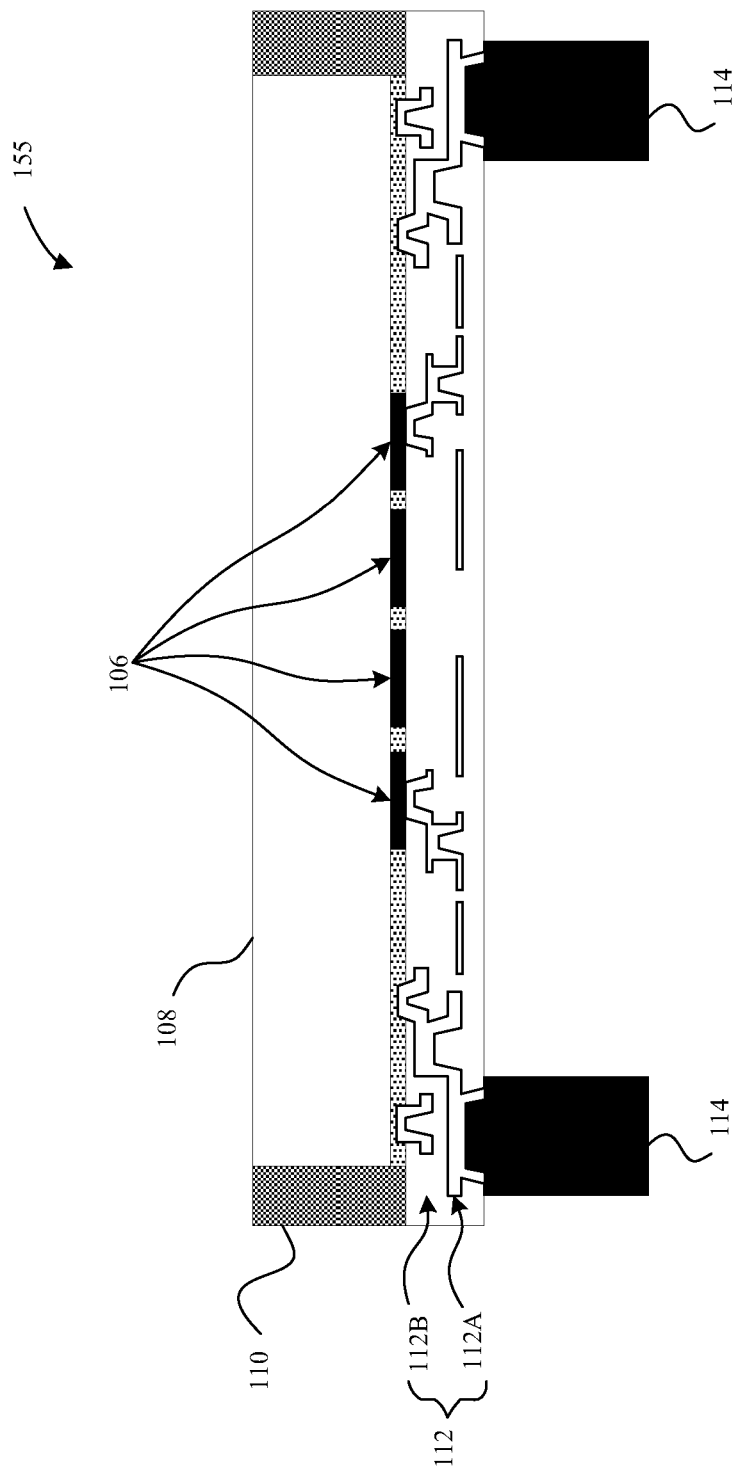
FIG. 1I is a cross-sectional side view illustration of a first FOWLP with a plurality of conductive pillars in accordance with an embodiment.

Embodiments describe fanout wafer level packages (FOWLPs) and methods of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" and its variations means that a particular feature, structure, configuration, or characteristic described in connection with the embodiment is included in at least one embodiment. Thus, the appearances of the phrase "in one embodiment" or its variations in various places throughout this specification are not necessarily referring to the same embodiment. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments integrate fan out wafer level packaging into 3D and system-in-package (SiP) solutions. For example, embodiments describe FOWLP SiP solutions in which multiple components are integrated into one package. Embodiments also describe FOWLP 3D solutions that may allow for reduced channel lengths, and reduced real estate of the package. In another aspect, the integration of fan out wafer level packaging into 3D and system-in-package (SiP) solutions may allow for an overall reduction of package z-height. For example, this may be attributed to the stacking of redistribution layers (RDLs) with conductive pillars within a package, as opposed to conventional solder bumping package on package, or die on die.

In an embodiment, integration of FOWLPs includes forming a first FOLWP, followed by forming a second FOWLP that includes the first FOWLP. Such a package may be characterized as a FOWLP in FOWLP. The first FOLWP may include a first routing layer (such as an RDL), a first die on a top side of the first routing layer, and a first molding compound encapsulating the first die on the first routing layer. A plurality of conductive pillars may extend from a bottom side of the first routing layer. In an embodiment, the second FOWLP includes the first FOWLP. In such a configuration, the plurality of conductive pillars is on a top side of a second routing layer (such as an RDL). A second die is on a top side of the second routing layer, and a second molding compound encapsulates the first FOWLP and the second die on the second routing layer. For example, the second molding compound may encapsulate the first molding compound, first routing layer, the plurality of conductive pillars, and the second die on the second routing layer.

In the following description, various methods and configurations are described for forming FOWLPs. It is to be appreciated, that the following description made with regard to FOWLPs may also be used for other types of IC packages and mixed logic-memory package stacks. In addition, the processing sequences may be compatible with both wafer level packages (WLP), and integration with surface mount substrates such as LGA, QFN, and ceramic substrates.

Referring now to FIGS. 1A-1H, cross-sectional side view illustrations are provided to illustrate a method of forming a first FOWLP in accordance with an embodiment. Referring to FIG. 1A, the process of forming the first FOWLP can begin with a carrier substrate 102, e.g., a silicon wafer, a glass wafer, a metal carrier etc. Referring to FIG. 1B, an adhesive layer 104 is applied on the carrier substrate 102. For example, the layer 104 is a temporary adhesive, e.g., a polyimide adhesive, a polymeric bonding agent, adhesive tapes, etc.

Referring to FIG. 1C, a plurality of die 108 is transferred to the adhesive layer 104 using a suitable technique such as a pick and place machine. As shown, an exemplary die 108 includes a passivation layer 105 and exposed contact pads 106.

Referring now to FIG. 1D, the plurality of die 108 is encapsulated in a first molding compound 110 on the adhesive layer 104. As used herein, "encapsulating" does not require all surfaces to be encased within a molding compound. For example, as illustrated in FIG. 1D the lateral sides of die 108 are encased in first molding compound 110, while the molding compound is not formed over the top surface of the die 108. As will become apparent in the following description, in some embodiments the height of the molding compound 110 may contribute to the overall z-height of the package. Furthermore, additional encapsulation operations may be subsequently performed in order to provide chemical and mechanical protection to the top surface of the die 108. Accordingly, in some embodiments, the amount of molding compound is controlled to achieve a specified height. Alternatively, an amount of the molding compound 110 can be removed after application in order to expose the top surfaces of the die 108. However, it is not required that that the top surfaces of the die 108 are exposed, and the molding compound 110 may cover the top surfaces of the die 108 in an embodiment.

The temporary adhesive layer 104 and carrier substrate 102 may then be removed after application of the molding compound resulting in a plurality of embedded die 108 with exposed contact pads 106, as illustrated in FIG. 1E. Referring now to FIG. 1F, a routing layer 112 is formed over the bottom side of die 108 (having contact pads 106) and the first molding compound 110. In one embodiment, routing layer 112 is a redistribution layer including one or more redistribution lines 112A and passivation layers 112B. The material of redistribution lines 112A can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer can be any suitable insulating materials such as an oxide, or polymer (e.g. polyimide). In an embodiment, a redistribution line 112A of routing layer 112 is formed on the contact pads 106, and may be formed directly on the contact pads, using a suitable technique such as sputtering, followed by etching to form the redistribution line. A routing layer 112 including multiple redistribution lines 112A and passivation layers 112B can be formed using a sequence of deposition and patterning resulting in the structure illustrated in FIG. 1F.

Referring now to FIG. 1G-1H, a first plurality of conductive pillars 114 is formed on a bottom side of the routing layer 112, and the wafer level stack 100 is singulated along the dotted lines to obtain individual first FOWLP packages 155. In one embodiment, the conductive pillars 114 are plated on the bottom side of the routing layer 112 such that each of pillars 114 extends out of the routing layer 112. In the illustrated embodiment, pillars 114 are plated closer to the edges than to the centers of the first FOWLP packages 155 such that a gap exists between pillars 114. In accordance with embodiments, the height and spacing between the pillars 114 is controlled for placement of the pillars 114 around one or more die mounted on another substrate. It is to be appreciated that the plurality of conductive pillars 114 can be more than two pillars. In one embodiment, the plurality of pillars 114 is made of a metallic material such as: copper (Cu); titanium (Ti); nickel (Ni); gold (Au); a combination of at least one of Ti, Ni, Au, or Cu; or other suitable metals, alloys, or combinations of metals and/or alloys.

Referring now to FIG. 1I, a detailed cross-sectional side view illustration is provided of a first singulated FOWLP 155 that is created in accordance with the process described above in FIGS. 1A-1H. In one embodiment, each first FOWLP package 155 includes a first routing layer 112, a first die 108 on a top side of the first routing layer, and a first molding compound 110 encapsulating the first die 108 on the first routing layer 112. A first plurality of pillars 114 additionally extends from a bottom side of the first routing layer 112. The first routing layer 112 may be formed on the bottom side of the die 108 and the first molding compound 110. In an embodiment, first routing layer 112 is a redistribution layer that includes one or more redistribution lines 112A and one or more passivation layers 112B. In one embodiment, a redistribution line 112A is formed on and bonded to one or more of the contact pads 106 on the bottom side of the die 108. In an embodiment, the routing layer 112 has a thickness of approximately 20 µm. However, embodiments are not so limited, and this thickness is provided for illustrational purposes. In an embodiment, the routing layer has a thickness of less than 50 µm, or more specifically less than 30 µm.

Figure 2F:
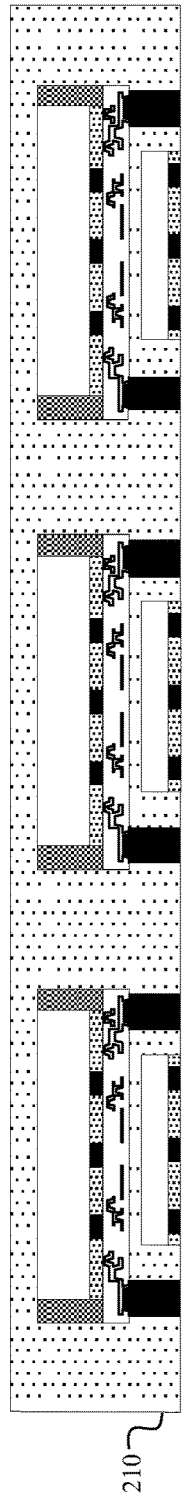

Referring now to FIGS. 2A-2I, cross-sectional side view illustrations are provided to illustrate a method of forming a second FOWLP 200 in accordance with an embodiment. Referring to FIGS. 2A-2B, the process of forming the second FOWLP can begin with a carrier substrate 202 and adhesive layer 204, e.g., similar to or the same as carrier substrate 102 and adhesive layer 104 described above in FIGS. 1A-1I. Referring to FIG. 2C, a plurality of die 208 is transferred to the adhesive layer 204 using a suitable technique such as a pick and place machine. As shown, an exemplary die 208 includes a passivation layer 205 and exposed contact pads 206.

A plurality of first FOWLP 155 is transferred to the adhesive layer 204 using a suitable technique such as a pick and place machine as illustrated in FIG. 2D. In the embodiment illustrated, the conductive pillars 114 of the first FOWLPs 155 are taller than the die 208 such that a gap exists between a bottom surface of the first routing layer 112 and a top surface of each corresponding die 208. In accordance with embodiments, the gap separating the first routing layer 112 and die 208 contributes to the overall z-height of the completed package being formed. Thus, a minimal gap may be utilized to compensate for alignment tolerances, and substrate irregularities. For example, the gap may be on the order of several or tens of microns. In this manner, the total separation distance between die 108 and 208 is the total thickness of the first routing layer 112 and gap between the first routing layer and the die 208. Accordingly, utilizing embodiments, a total vertical separation distance can be achieved that is much less than a conventional solder ball height of 100-200 µm, for example. Still referring to FIG. 2D, the conductive pillars 114 for each first FOWLP 155 may laterally surround one or more corresponding die 208 on the adhesive layer 204. In one embodiment, the die 208 is located directly under die 108 of first FOWLP 155. In one embodiment, the die 208 is located at another location that is not directly under die 108 of the first FOWLP 155.

Referring now to FIG. 2E, the first FOWLP 155 and the die 208 are then encapsulated in a second molding compound 210 on the adhesive layer 204. The second molding compound can be different from or the same as the first molding compound 110 of first FOWLP 155. In one embodiment, the second molding compound 210 encapsulates the top and lateral sides of FOWLP 155 and die 208, as shown in FIG. 2E. As shown, the second molding compound 210 surrounds the pillars 114 of the first FOWLP 155 and surrounds the die 208 underneath the first FOWLP 155. Furthermore, depending upon application, the second molding compound 208 may or may not cover the top surface of die 108. As described above regarding the first molding compound 110, any amount of the second molding compound 210 over the top surface of the die 108 contributes to the overall z-height of the completed package. In the embodiment illustrated, the second molding compound 210 is formed over the die 108 of the first FOWLP 155 in order to provide physical and chemical protection. In another embodiment, height of the second molding compound 210 may be reduced through grinding or approaches to achieve the same, for example to expose the top surface of the die 108, if additional molding will be performed during subsequent operations, for example, as described with regard to FIGS. 3F-3J.

Figure 2G:
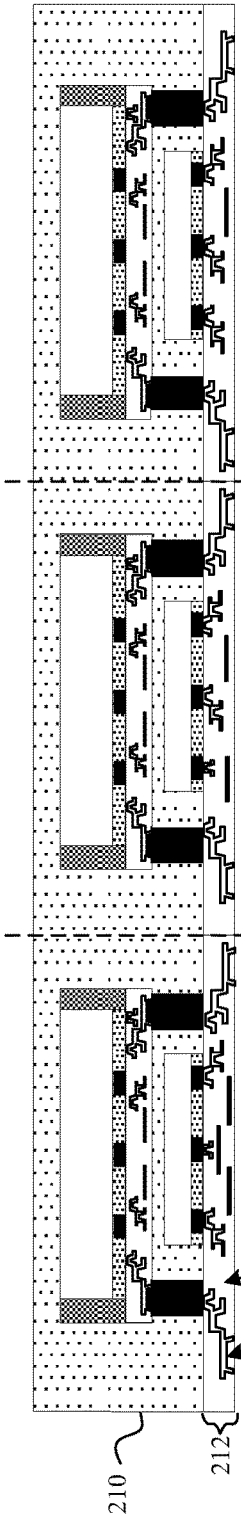

Referring now to FIGS. 2F-2G, adhesive layer 204 and carrier substrate 202 are removed, followed by the formation of routing layer 212 similarly as described above with regard to FIGS. 1E-1F. In the particular embodiment illustrated in FIG. 2G, routing layer 212 makes electrical contact with the conductive pillars 114 of the first FOWLP 155 as well as the second die 208. For example, a routing layer 212 may be a redistribution layer including one or more redistribution lines 212A and passivation layers 212B. In an embodiment, a redistribution line 212A is formed on the conductive pillars 114 and contact pads 206 of the second die 208 using a suitable technique such as evaporation or sputtering, followed by etching to form the redistribution line. A routing layer 212 including multiple redistribution lines and passivation layers can be formed using a sequence of deposition and patterning resulting in the structure illustrated in FIG. 2G.

FIGS. 2H-2I illustrated the formation of conductive bumps 216 (e.g. solder balls) on a bottom side of the second routing layer 212, followed by singulating the wafer stack 200 to obtain individual second FOWLPs 255 in accordance with an embodiment. In another embodiment, a plurality of conductive pillars 214 is plated on the bottom side of the second routing layer 212 in lieu of placing conductive bumps 216—for example, as illustrated in FIGS. 2L and 3A-3B, which are described in further detail below.

Figure 2J:
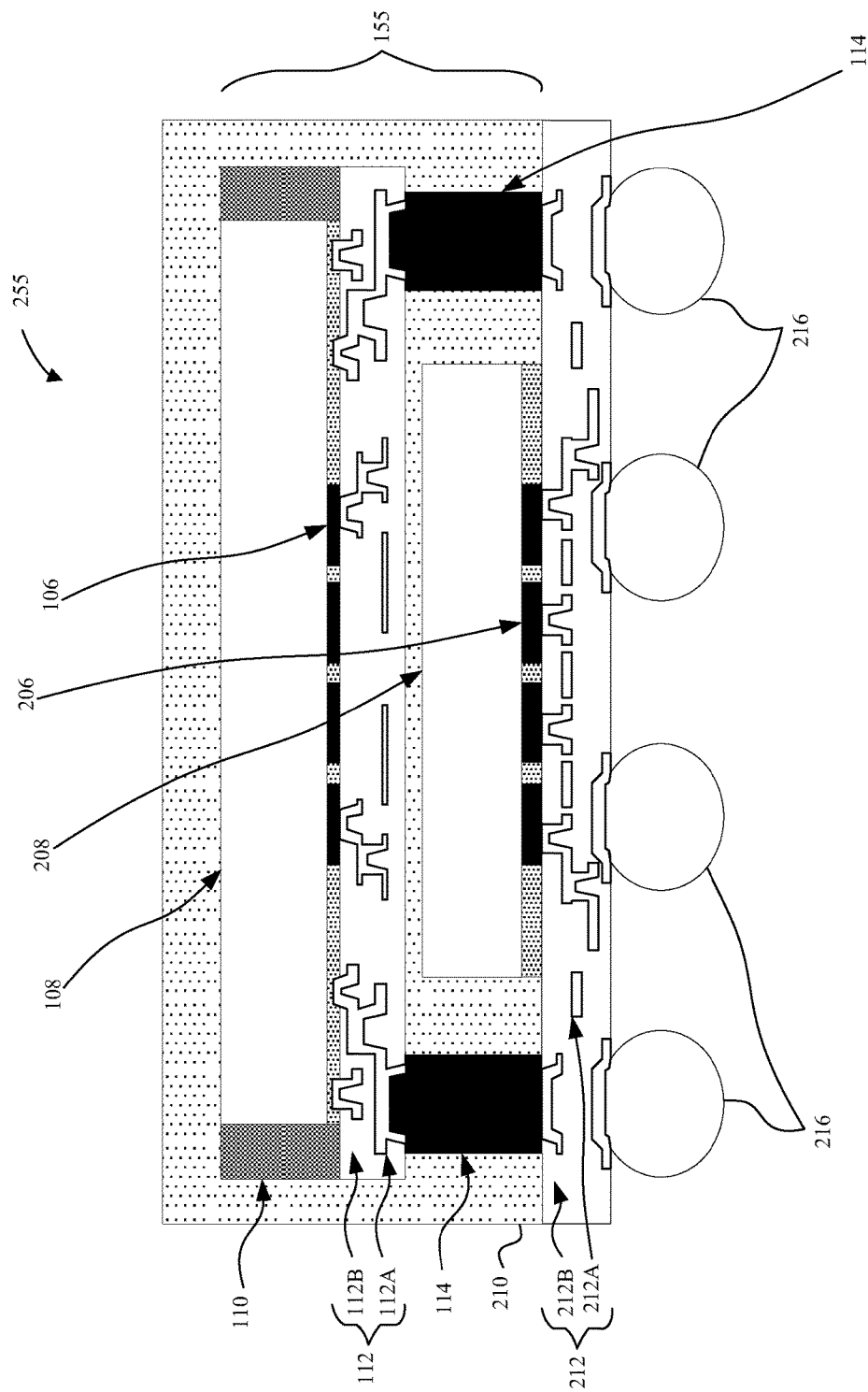
FIG. 2J is a cross-sectional side view illustration of a second FOWLP with conductive bumps in accordance with an embodiment.

Referring now to FIG. 2J, a detailed cross-sectional side view is provided of a second singulated FOWLP 255 with conductive bumps in accordance with an embodiment. In an embodiment, the second FOWLP 255 includes a second routing layer 212, a second die 208, and a first FOWLP 155. In one embodiment, the second FOWLP 255 is formed using the method described above in connection with FIGS. 2A-2I. As shown, the second routing layer 212 is formed on the second molding compound 210, the conductive pillars 114 and the second die 208. In an embodiment, a bottom side of the contact pads 206, conductive pillars 114 and molding compound 210 are coplanar. In an embodiment, routing layer 212 is a redistribution layer including one or more redistribution lines 212A and passivation layers 212B. In one embodiment, the second routing layer 212 is similar to routing layer 112 that is described above in FIGS. 1A-1I. In one embodiment, the one or more redistribution lines 212A are formed on, bonded to, and in electrical contact with the contact pads 206 of the second die 208 and the conductive pillars 114. In the embodiment illustrated in FIG. 2J, conductive bumps 216 (e.g. solder balls) are placed on a bottom side of the second routing layer 212.

Figure 2K:
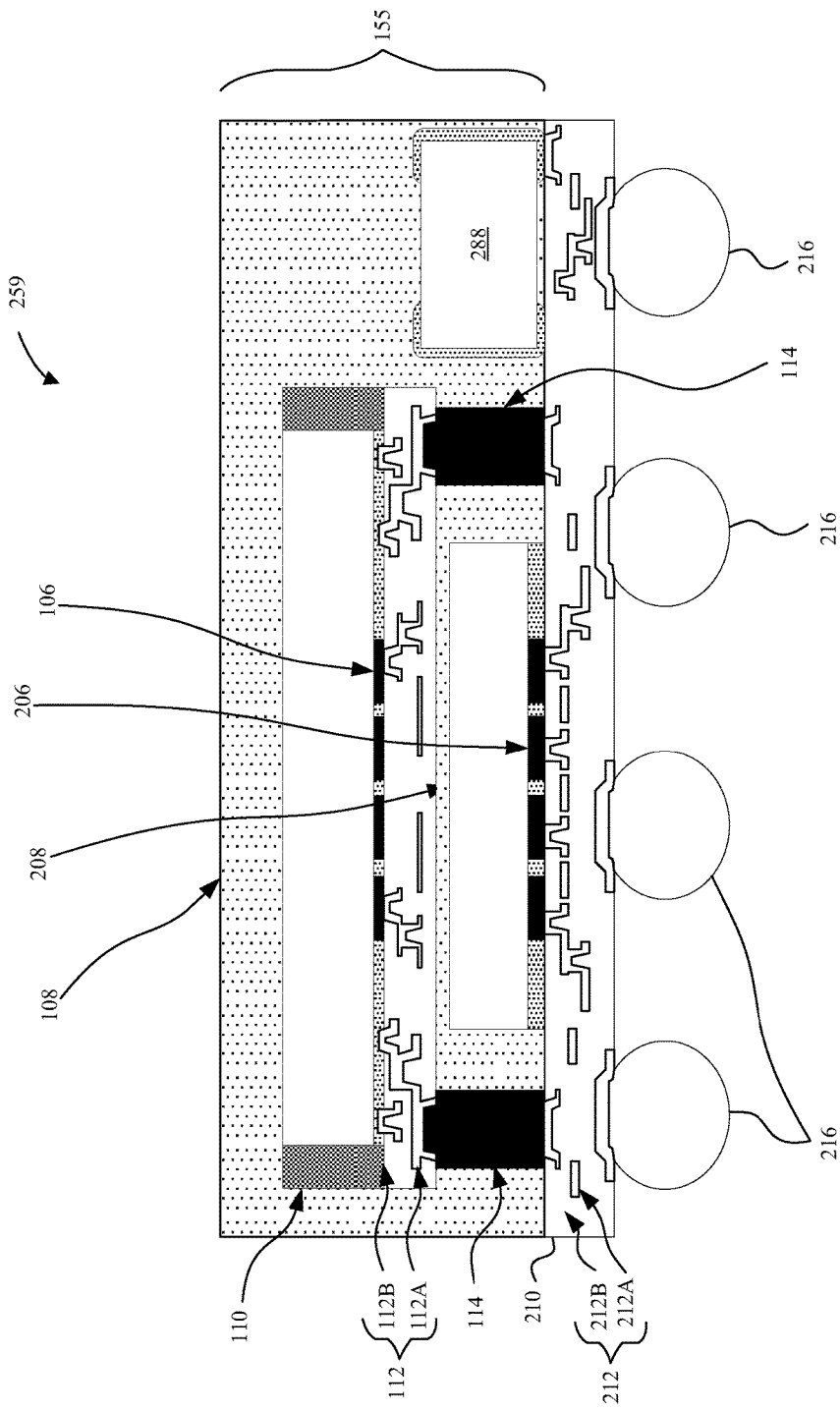
FIG. 2K is a cross-sectional side view illustration of a second FOWLP with a plurality of conductive pillars and at least one passive element in accordance with an embodiment.
Figure 2L:
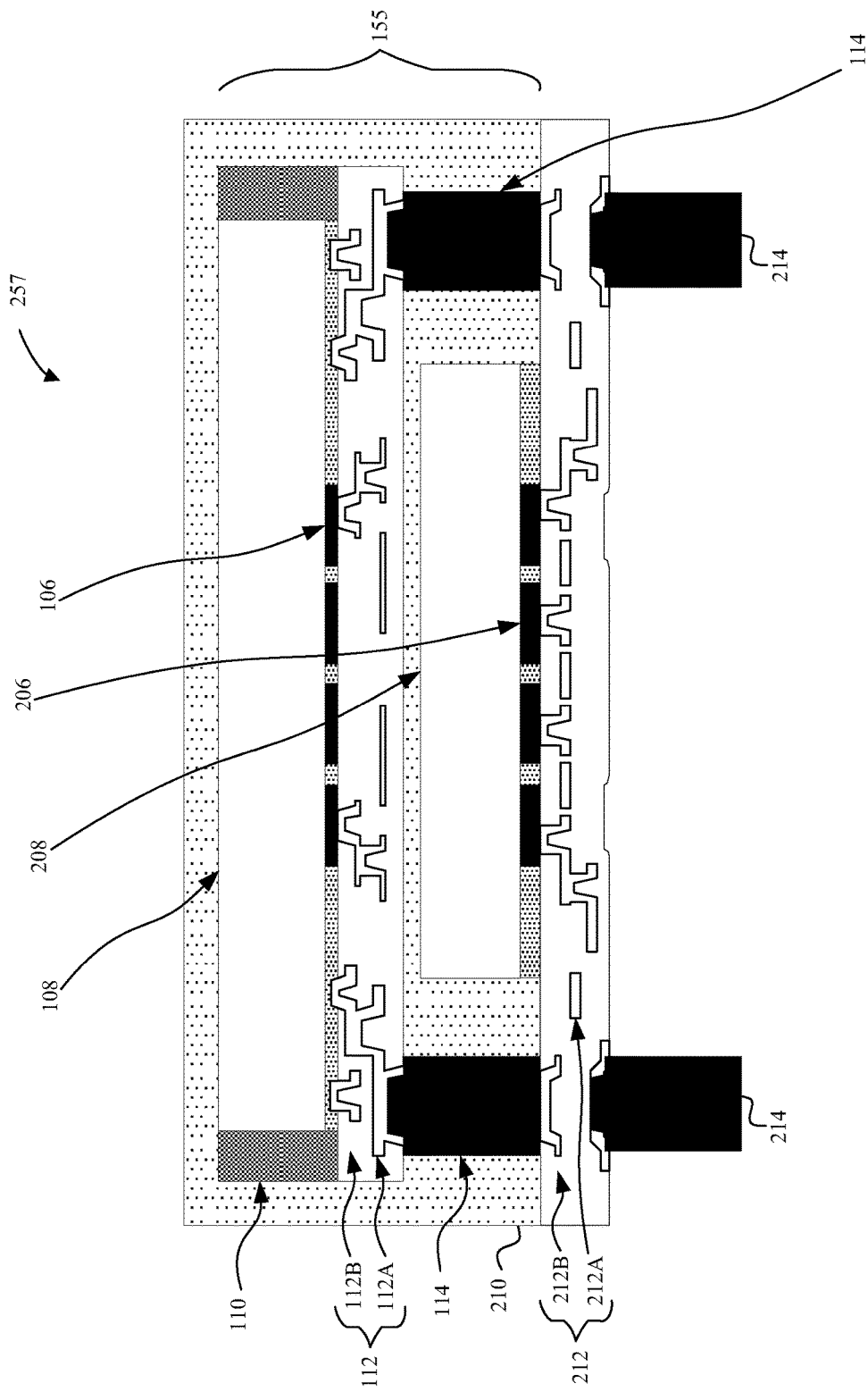
FIG. 2L is a cross-sectional side view illustration of a second FOWLP with a plurality of conductive pillars in accordance with an embodiment.

With regard now to FIG. 2K, which is a cross-sectional side view illustration of a second FOWLP 259 that includes a plurality of conductive pillars 114 and at least one passive element 288 in accordance with an embodiment. The second FOWLP 259 is a modification of the second FOWLP 255, which is described above in connection with FIG. 2J. In contrast with the second FOWLP 255, the second FOWLP 259 includes one or more passive elements 288. In one embodiment, the one or more passive elements 288 is formed from at least one of a resistor, a capacitor, an inductor, a filter, a balun, a transceiver, a receiver, other passive element known in the art. In one embodiment, passive element(s) 288 is formed from a combination of passive elements known in the art, e.g., an RL circuit, an RC circuit, etc.

In one embodiment, the second FOWLP 259 is formed using a modification of the method that is used to form the second FOWLP 255 (as described above in connection with FIGS. 2A-2I). In this embodiment, one difference between the method used to form the second FOWLP 255 and the method used to form the second FOWLP 259 is the operations described above in connection with FIGS. 2C-2D. At these operations, a plurality of the passive elements 288 is transferred to the adhesive layer 204 before or after the plurality of first FOWLP 155 is transferred to the adhesive layer and prior to performance of the operations described above in connection with FIGS. 2E-2I. After the plurality of the first FOWLP 155 and the plurality of passive elements 288 are on the adhesive layer 204, the second FOWLP 259 is formed in accordance with the operations described above in connection with FIGS. 2E-2I (while also taking into account the passive element(s) 288). In the illustrated embodiment of the second FOWLP 259, the passive element 288 is not directly under the die 108, is outside the periphery of the conductive pillars, and is adjacent to only one of the pillars 114 of the first FOWLP 155, however, other embodiments are not so limited. In one example, one or more of the passive elements 288 are not directly under die 108 and are adjacent to each of the pillars 114. In another example, one or more of the passive elements 288 are not directly under die 108, are adjacent to each of the pillars 114, and are outside the periphery of the conductive pillars.

Referring now to FIG. 2L, in an embodiment, rather than placing conductive bumps 216, conductive pillars 214 are plated onto the bottom side of the second routing layer 212 to form a second FOWLP 257. The illustrated embodiment of the second FOWLP 257 of FIG. 2L is a modification of the illustrated embodiment of the second FOWLP 255 of FIG. 2J. In one embodiment, the second FOWLP 257 is used to form a third FOWLP having at least three molding compounds, as described below in FIGS. 3A-3J. Even though the illustrated embodiment of the second FOWLP 257 is a modification of the illustrated embodiment of the second FOWLP 255, it is to be appreciated that other embodiments are not so limited. For example, and with reference to the illustrated embodiment of the second FOWLP 259 of FIG. 2K, conductive pillars are plated onto the bottom side of the second routing layer 212 of the second FOWLP 259 in lieu of placing conductive bumps 216 and the resulting second FOWLP 259 is used to form a third FOWLP having at least three molding compounds, as described below in FIGS. 3A-3J.

Figure 3F:
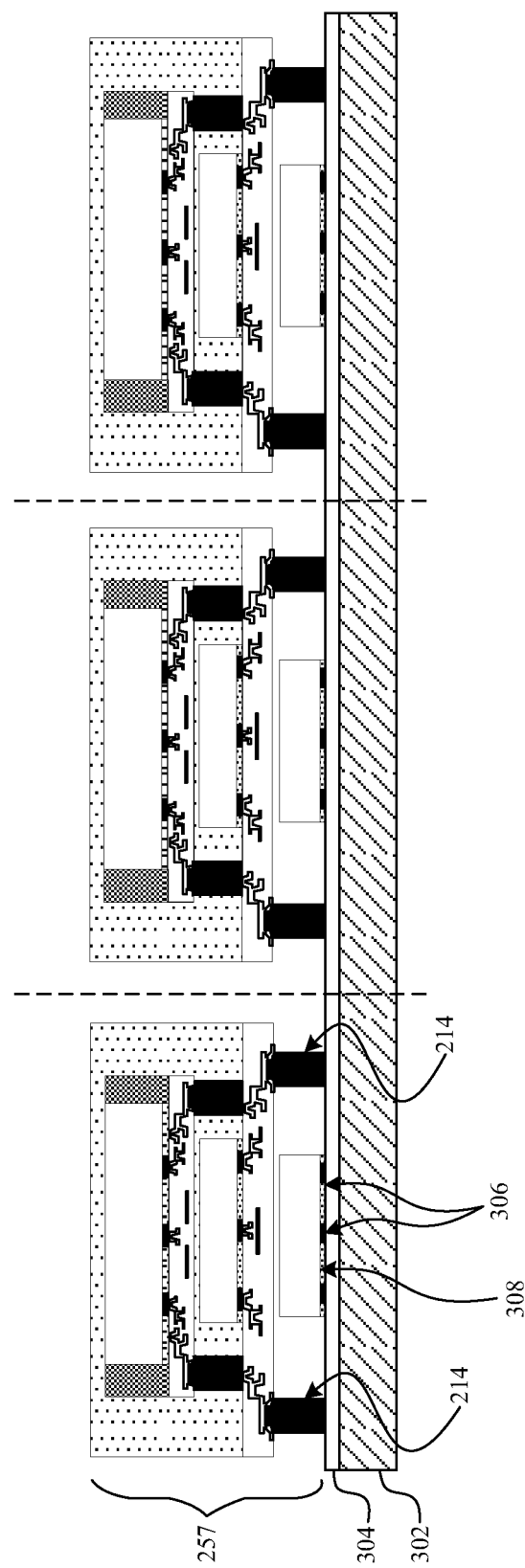

Referring now to FIGS. 3A-3J, cross-sectional side view illustrations are provided to illustrate a method of forming a third FOWLP in accordance with an embodiment. Referring to FIG. 3A, in an embodiment, rather than placing conductive bumps on the bottom side of the routing layer 212 as described above with regard to FIG. 2H, conductive pillars 214 are plated on the bottom side of the routing layer. Conductive pillars 214 may be plated using similar techniques used for the formation of conductive pillars 114. Following the formation of the conductive pillars 214, the wafer level stack 300 is singulated to obtain individual second FOWLP packages 257 as illustrated in FIG. 3B.

Referring now to FIGS. 3C-3D, the process of forming the third FOWLP may include a carrier substrate 302 and adhesive layer 304, e.g., similar to or the same as carrier substrate 102 described above in FIGS. 1A-1I. In an embodiment, a plurality of die 308 is transferred to the adhesive layer 304 using a suitable technique such as a pick and place machine as illustrated in FIG. 3E. As shown, an exemplary die 308 includes a passivation layer 305 and exposed contact pads 306. Referring now to FIG. 3F, a plurality of second FOWLP 257 is transferred to the adhesive layer 304 using a suitable technique such as a pick and place machine. In the embodiment illustrated, the conductive pillars 214 of the second FOWLPs 257 are taller than the die 308 such that a gap exists between a bottom surface of the second routing layer 212 and a top surface of each corresponding die 308. In accordance with embodiments, the gap separating the second routing layer 212 and die 308 contributes to the overall z-height of the completed package being formed. Thus, a minimal gap may be utilized to compensate for alignment tolerances, and substrate irregularities similarly as described above for the gap between the first routing layer 112 the die 208. Accordingly, utilizing embodiments, a total vertical separation distance between die 308 and 208 can be achieved that is much less than a conventional solder ball height of 100-200 µm, for example. Still referring to FIG. 3F, the conductive pillars 214 for each second FOWLP 257 may laterally surround one or more corresponding die 308 on the adhesive layer 304. In one embodiment, each die 308 is located directly under a corresponding die 208 of second FOWLP 257. In one embodiment, each die 308 is located at another location that is not directly under die 208 of a second FOWLP 257.

Figure 3G:
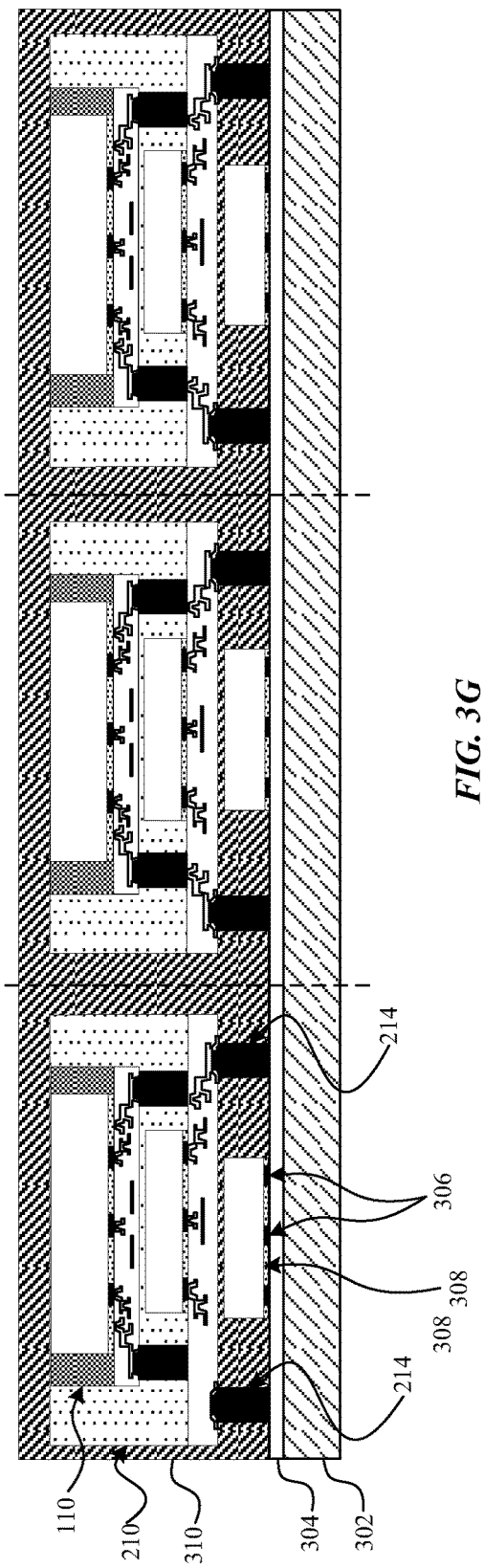

In one embodiment, performance of the operations described above in connection with FIGS. 3E-3F includes transferring one or more passive elements 288 (described above in connection with FIG. 2K) to the adhesive layer 304 before or after the plurality of second FOWLP 257 is transferred to the adhesive layer 304 and prior to performance of the operations described below in connection with FIGS. 3G-3J. After the plurality of second FOWLP 257 and the one or more passive elements 288 are on the adhesive layer 304, a third FOWLP 355 is formed in accordance with the operations described below in connection with FIGS. 3G-3J (while also taking into account the passive element(s) 288). In one embodiment of the third FOWLP 259, the passive element(s) 288 are outside the periphery of the conductive pillars 214 and adjacent to one or more of the pillars 214, however, other embodiments are not so limited. In one example, one or more of the passive elements 288 are outside the periphery of the conductive pillars. In one example, one or more of the passive elements 288 are outside the periphery of the conductive pillars and are not directly under die 208.Referring now to FIG. 3G, the second FOWLP 257 and the die 308 are then encapsulated in a third molding compound 310 on the adhesive layer 304. In one embodiment, the second FOWLP 257, the die 308, and the one or more passive elements 288 are encapsulated in the third molding compound 310 on the adhesive layer 304. The third molding compound can be different from or the same as the first molding compound 110 or second molding compound 210. In one embodiment, the third molding compound 310 encapsulates the top and lateral sides of FOWLP 257 and die 308, as shown in FIG. 3G. As shown, the third molding compound 310 surrounds the pillars 214 of the second FOWLP 257 and surrounds the die 308 underneath the second FOWLP 257. Furthermore, depending upon application, the third molding compound 310 may or may not cover the top surface of die 108. As described above regarding the first molding compound 110 and second molding compound 210, any amount of the third molding compound 310 over the top surface of the die 108 contributes to the overall z-height of the completed package. In the embodiment illustrated, the third molding compound 310 is formed over the die 108 of the first FOWLP 155 in order to provide physical and chemical protection. In another embodiment, height of the third molding compound 310 may be reduced, for example to expose the top surface of the die 108, if additional molding will be performed during subsequent operations.

Figure 3H:
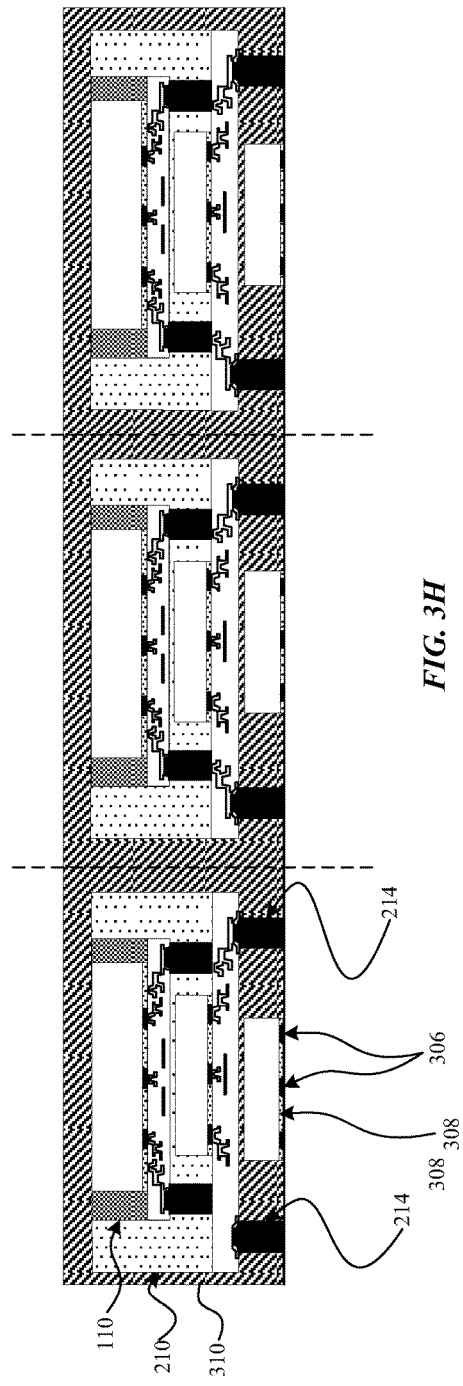
Figure 3I:
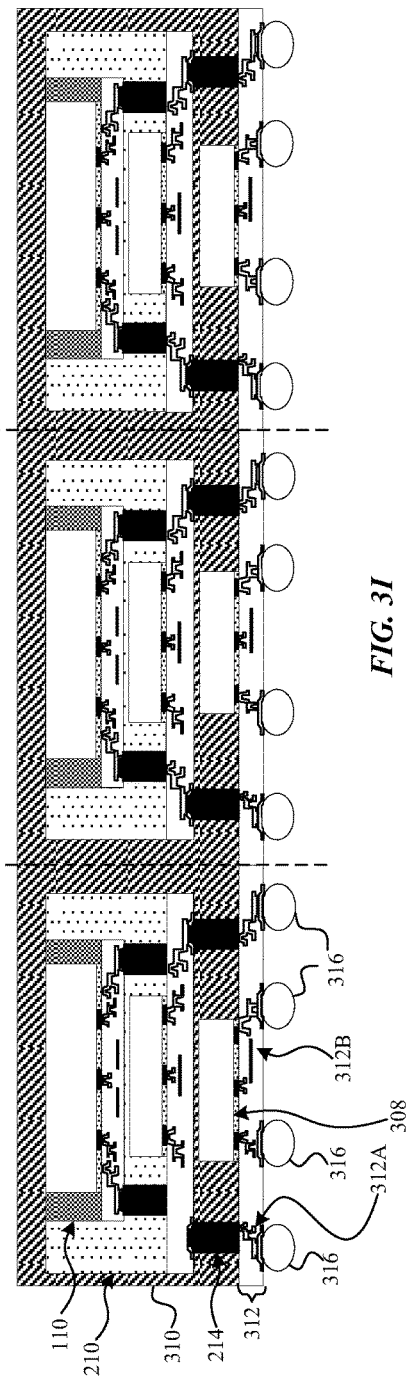

Referring now to FIGS. 3H-3I, adhesive layer 304 and carrier substrate 302 are removed, followed by the formation of routing layer 312 similarly as described above with regard to FIGS. 2F-2G. In the particular embodiment illustrated in FIG. 3I, routing layer 312 makes electrical contact with the conductive pillars 214 of the second FOWLP 257 as well as the third die 308. For example, routing layer 312 may be a redistribution layer including one or more redistribution lines 312A and passivation layers 312B. In an embodiment a redistribution line 312 is formed on, and may be formed directly on, the conductive pillars 214 and contact pads 306 of the third die 308 using a suitable technique such as evaporation or sputtering, followed by etching to form the redistribution line. A routing layer 312 including multiple redistribution lines 312A and passivation layers 312B can be formed using a sequence of deposition and patterning.

Figure 3J:
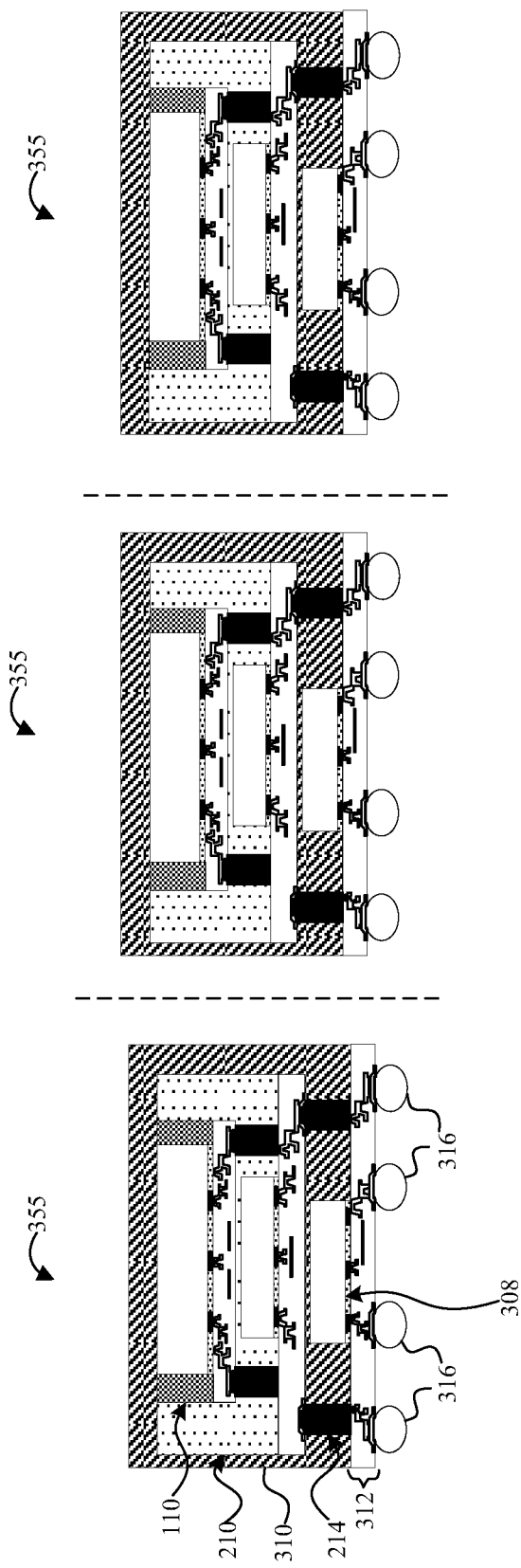
Figure 3K:
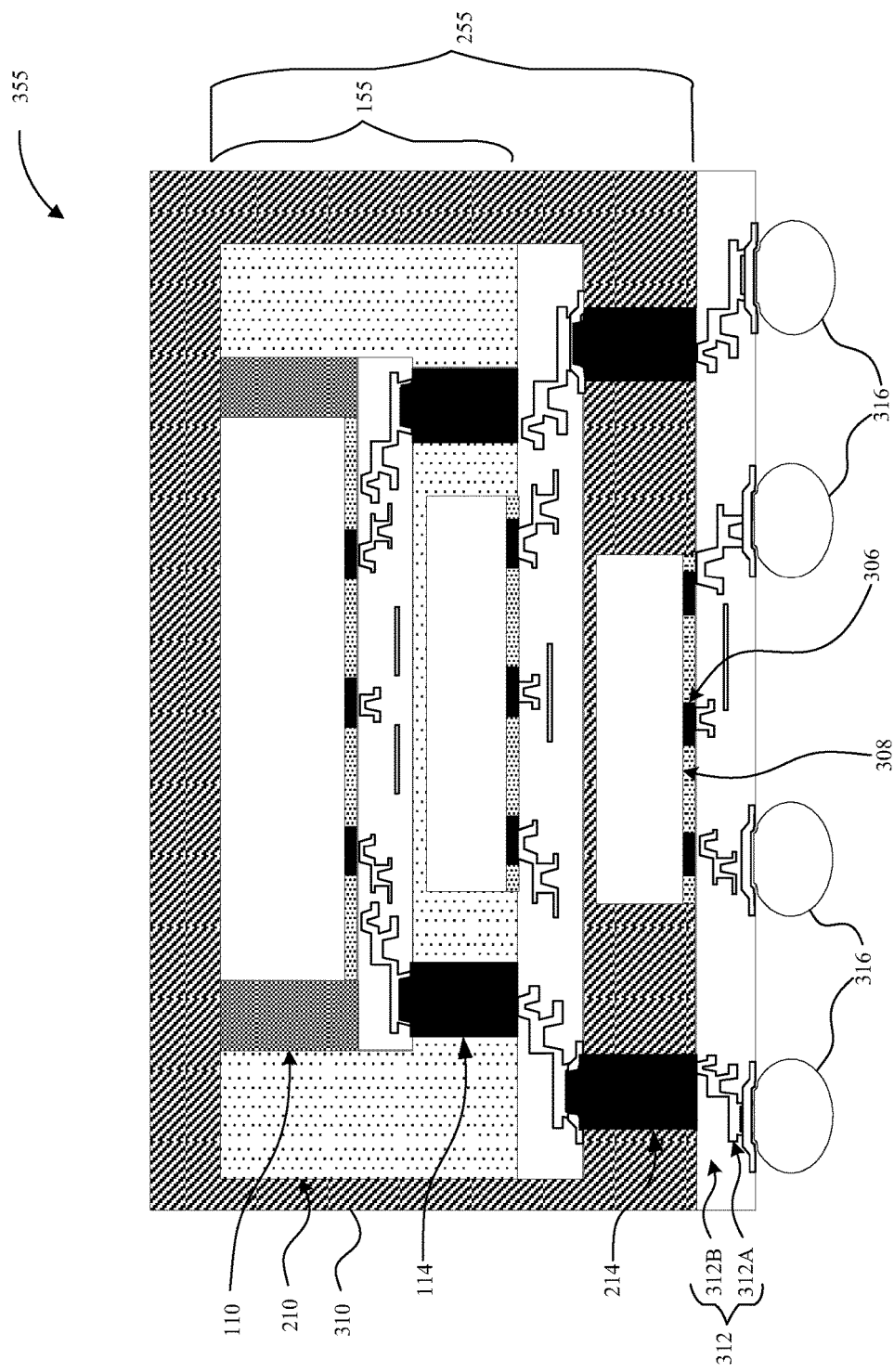
FIG. 3K is a cross-sectional side view illustration of a third FOWLP with conductive bumps in accordance with an embodiment.

In an embodiment conductive bumps 316 (e.g. solder balls) are formed on a bottom side of the third routing layer 312. In an embodiment, a plurality of conductive pillars is plated on the bottom side of the second routing layer 312 in lieu of placing conductive bumps 316. Following the formation of the conductive bumps 316, the wafer level stack 300 is singulated to obtain individual third FOWLP packages 355 as illustrated in FIG. 3J. Referring now to FIG. 3K, a detailed cross-sectional side view is provided of a third singulated FOWLP 355 with conductive bumps in accordance with an embodiment. In an embodiment, the third FOWLP 355 includes a third routing layer 312, a third die 308, and a second FOWLP 257. As described above, a second FOWLP 257 includes a first FOWLP 155. As shown, the third routing layer 312 is formed on the third molding compound 310, the conductive pillars 214 and the third die 308. In an embodiment a bottom surface of the third molding compound 310, conductive pillars 214, and contact pads 306 may be coplanar. In an embodiment, routing layer 312 is a redistribution layer including one or more redistribution lines 312A and passivation layers 312B. In one embodiment, the routing layer 312 is similar to routing layer 212 that is described above in FIGS. 2A-2L. In one embodiment, the one or more redistribution lines of routing layer 312 are bonded to an in electrical contact with the contact pads 306 of the third die 308 and the conductive pillars 214. In the embodiment illustrated in FIG. 3K, conductive bumps 316 (e.g. solder balls) are placed on a bottom side of the routing layer 312. In an embodiment, rather than placing conductive bumps, conductive pillars are plated onto the bottom side of the third routing layer 312.

Figure 4A:
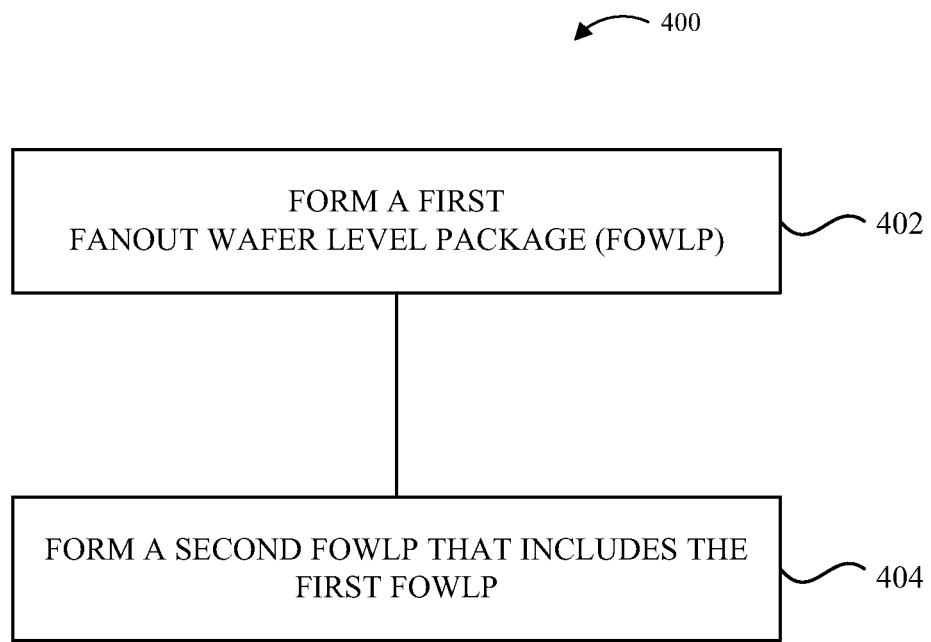
FIG. 4A is a process flow illustration of a method of forming a FOWLP in FOWLP in accordance with an embodiment.

Referring to FIG. 4A, a process flow 400 is provided for a method of forming a FOWLP in FOWLP in accordance with an embodiment. At block 402 a first FOWLP is formed, for example, using an embedded wafer level process. In one embodiment, the formation of the first FOWLP is in accordance with FIGS. 1A-1I as described above. In one embodiment, the formation of the first FOWLP is in accordance with the process flow 425, as described below in FIG. 4B. At block 404 a second FOWLP is formed that includes the first FOWLP. In one embodiment, the formation of the second FOWLP is in accordance with FIGS. 1A-1I and 2A-2L as described above. In one embodiment, the formation of the second FOWLP is in accordance with the process flow 450, as described below in FIG. 4C.

Figure 4B:
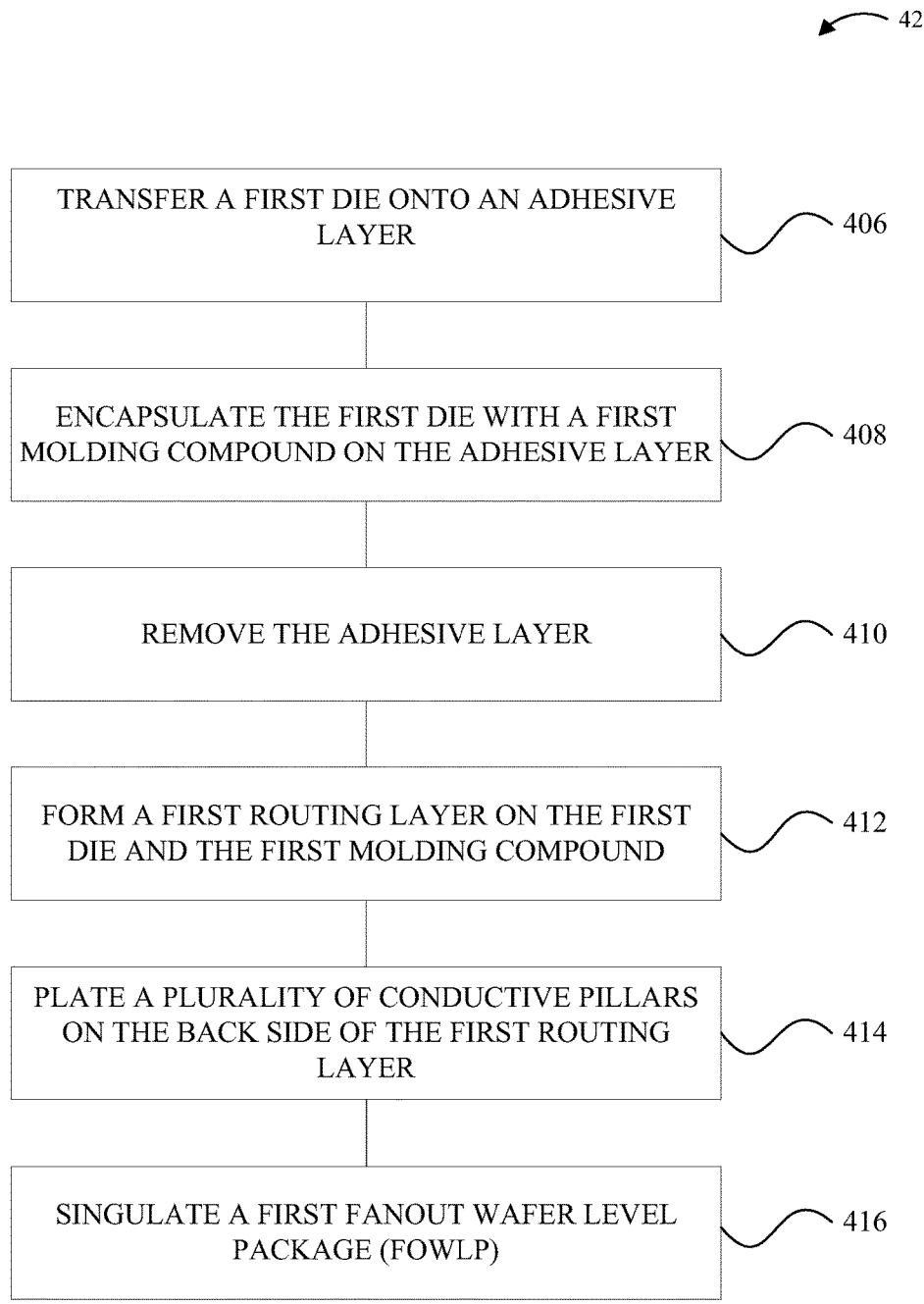
FIG. 4B is a process flow illustration of a method of forming a first FOWLP in accordance with an embodiment.

FIG. 4B includes an illustration of a process flow 425 for forming a first FOWLP in accordance with an embodiment. For example, process flow 425 may be an embedded wafer level process. At block 406 a first die is transferred onto a first adhesive layer. In one embodiment, block 406 is performed in accordance with FIGS. 1A-1C as described above. The first die is then encapsulated with a first molding compound on the adhesive layer at block 408. In one embodiment, block 408 is performed in accordance with FIG. 1D as described above. The adhesive layer is then removed at block 410, which may correspond to FIG. 1E described above. A first routing layer may then be formed on the first die and the molding compound at block 412, which may correspond to FIG. 1F described above.

Still referring to FIG. 4B, a plurality of conductive pillars is plated on a back side of the first routing layer at block 414, which may correspond to FIG. 1F described above. At this point individual first FOWLPs can be singulated from the die stack at block 416. In an embodiment, each first FOWLP may be similar to that described and illustrated with regard to FIG. 1H.

Figure 4C:
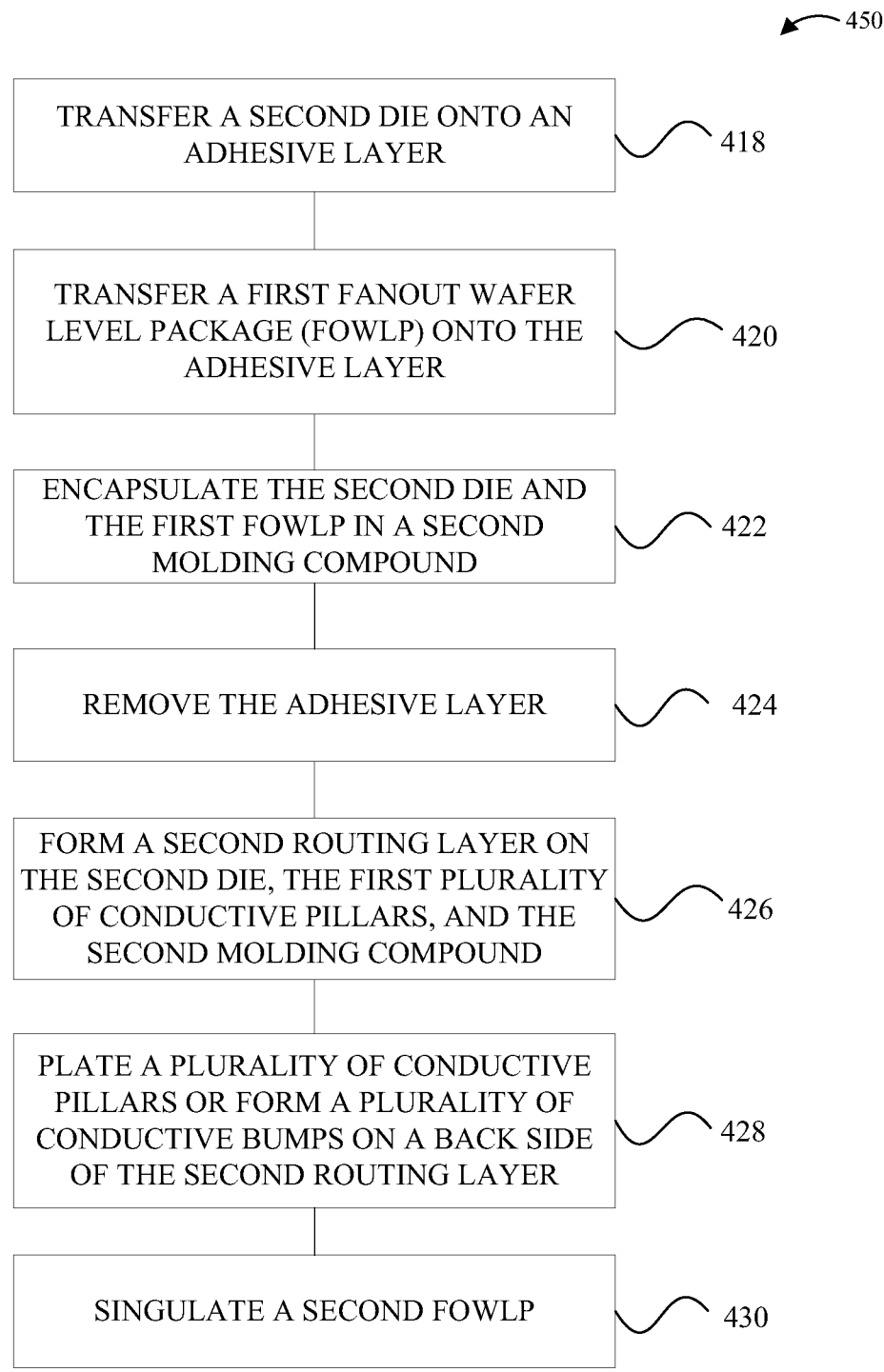
FIG. 4C is a process flow illustration of a method of forming a second FOWLP in accordance with an embodiment.

Referring now to FIG. 4C, a process flow 450 is provided for a method of forming a second FOWLP that includes the first FOWLP in accordance with an embodiment. Initially a second die is transferred onto an adhesive layer at block 418, followed by the transfer of a first FOWLP onto the adhesive layer at block 420 as described with regard to FIGS. 2A-2D above. The second die and first FOWLP are then encapsulated in a second molding compound at block 422. In one embodiment, block 422 is performed in accordance with FIG. 2E described above. The adhesive layer may then be removed at block 424, and a second routing layer formed on the second die, the molding compound, and the first plurality of pillars of the first FOWLP at block 426, for example, as described above with regard to FIGS. 2F-2G.

A plurality of conductive pillars or solder bumps (e.g. solder balls) may then be formed on a back side of the second routing layer at block 428. Second FOWLPs may then be singulated from the die stack at block 430. In one embodiment, solder bumps are formed similarly as described above with regard to FIG. 2H. In such an embodiment, the solder bumps may be formed for subsequent bonding of a singulated second FOWLP to a printed circuit board. In one embodiment, conductive pillars are formed similarly as described above with regard to FIG. 3A. In such an embodiment, the solder bumps may be formed for subsequent integration into a third FOWLP as described above with regard to FIGS. 3F-3K.

Figure 5:
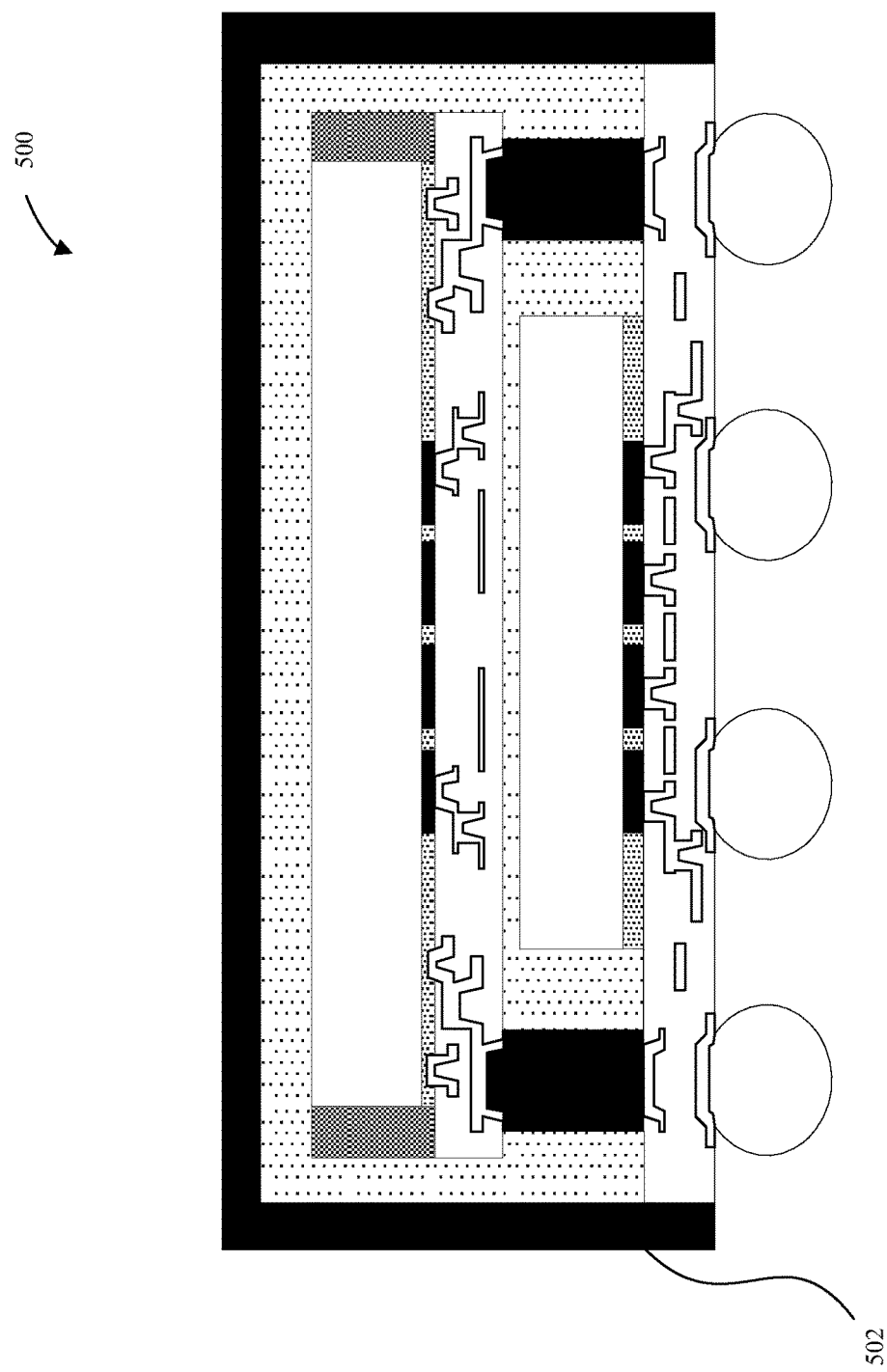
FIG. 5 is a cross-sectional side view illustration of a second FOWLP that includes a shielding layer in accordance with an embodiment.

Referring now to FIG. 5, a cross-sectional side view illustration of a singulated second FOWLP 500 is provided that includes a shielding layer in accordance with an embodiment. FOWLP 500 is similar to FOWLP 255 of FIG. 2J that is described above. For the sake of brevity, only the differences between FOWLP 500 of FIG. 5 and FOWLP 255 of FIG. 2J are described in the discussion relating to FIG. 5. One difference between FOWLP 500 and FOWLP 255 is that FOWLP 500 includes a shielding layer 502. In one embodiment, the shielding layer 502 is made of metallic material, e.g. any metal or metal alloy that is suitable for protecting FOWLP 500 from electromagnetic interference (EMI). While the illustration of FIG. 5 is specific to a shielding layer 502 on the FOWLP 255 of FIG. 2J, this is for illustrative purposes only and embodiments are not so limited. A shielding layer 502 may be applied to any of the package structures illustrated and described.

Figure 6:
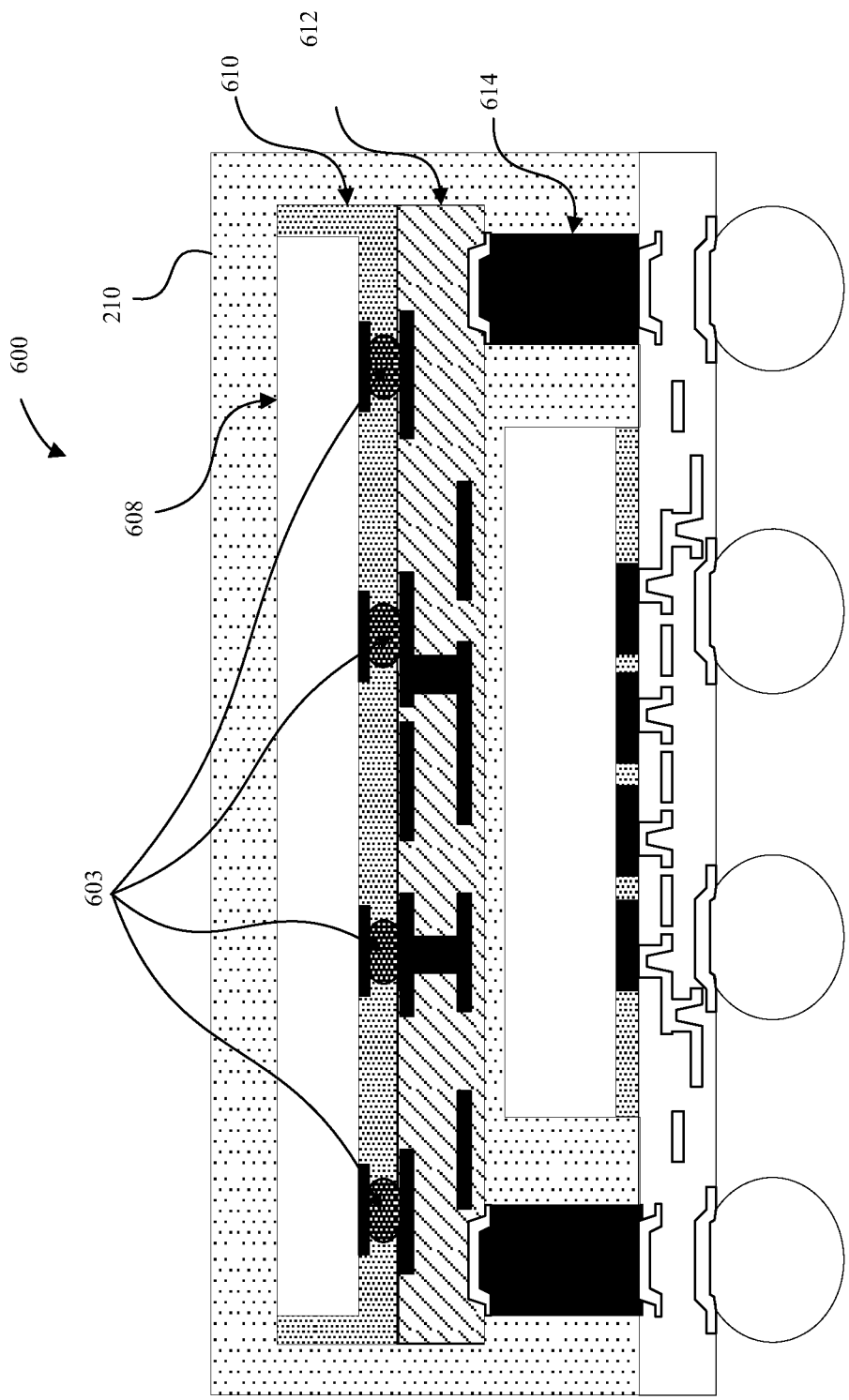
FIG. 6 is a cross-sectional side view illustration of a flip-chip in FOWLP in accordance with an embodiment.

Referring now to FIG. 6, a cross-sectional side view illustration is provided of a flip chip in FOWLP structure 600 in accordance with an embodiment. The structure illustrated in FIG. 6 is similar to FOWLP 255 of FIG. 2J that is described above with one difference being that the first die 608 is flip chip bonded to a wiring board 612 with conductive bumps 603. In an embodiment, a plurality of die 608 is flip chip bonded to wiring board 612, and encapsulated with a molding compound 610. A plurality of conductive pillars 614 may be plated on a back side of the wiring board 612. Individual first level packages may then be singulated, and then integrated into a second FOWLP as described above with regard to FIGS. 2A-2L resulting in the flip chip in FOWLP structure 600 illustrated in FIG. 6. In accordance with embodiments, die mounting techniques such as flip chip, direct chip attach (DCA) and direct die attach (DDA) may be used for die 608. While the illustration of FIG. 6 is similar to FOWLP 255 of FIG. 2J, this is for illustrative purposes only and embodiments are not so limited for integration of flip chip into a FOWLP structure.

Figure 7:
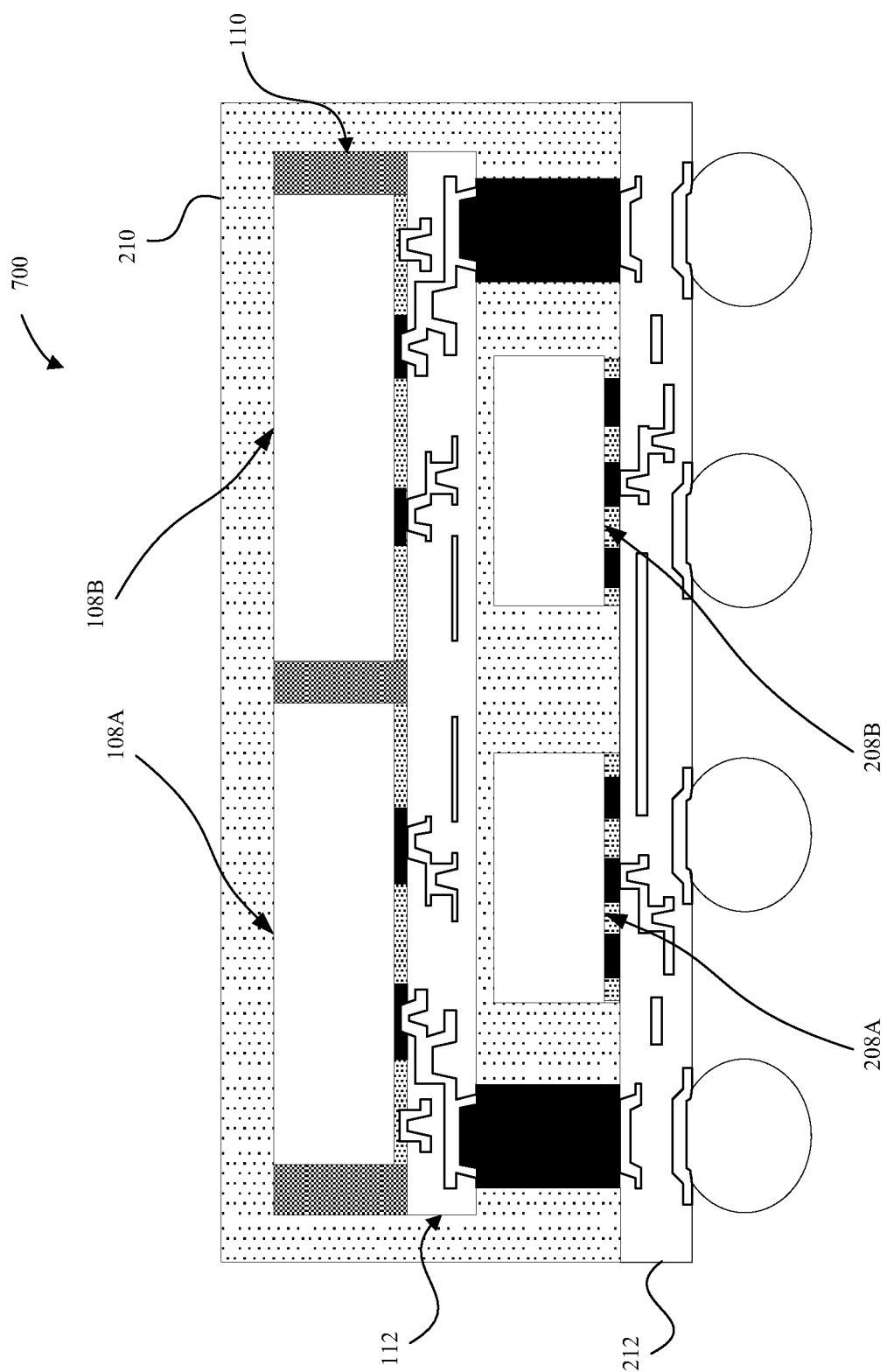
FIG. 7 is a cross-sectional side view illustration of a multiple component FOWLP in FOWLP in accordance an embodiment.

Referring now to FIG. 7, the above embodiments have been described with regard to single die 108, 208, 308, 608, etc. however, embodiments are not so limited, and multiple die may be used at each package level. FIG. 7 is a cross-sectional side view illustration of a multiple component FOWLP in FOWLP structure 700 in accordance with an embodiment. The structure illustrated in FIG. 7 is substantially similar to that illustrated and described above with regard to FIG. 2J, with instead multiple die 108A, 108B on first routing layer 112, and multiple die 208A, 208B on second routing layer 212. The particular configuration illustrated in FIG. 7 shows multiple die could be placed on any of the routing layers, or wiring boards, described above. Therefore a number of configurations are possible. Furthermore, the multiple die configurations are not limited to the specific structure shown in FIG. 7 and is compatible with the other packaging configurations described above. In an embodiment, a multiple die configuration can include a variety of passive components, active components, active and passive components, and system on chip. Accordingly, a variety of combinations are possible.

Figure 8:
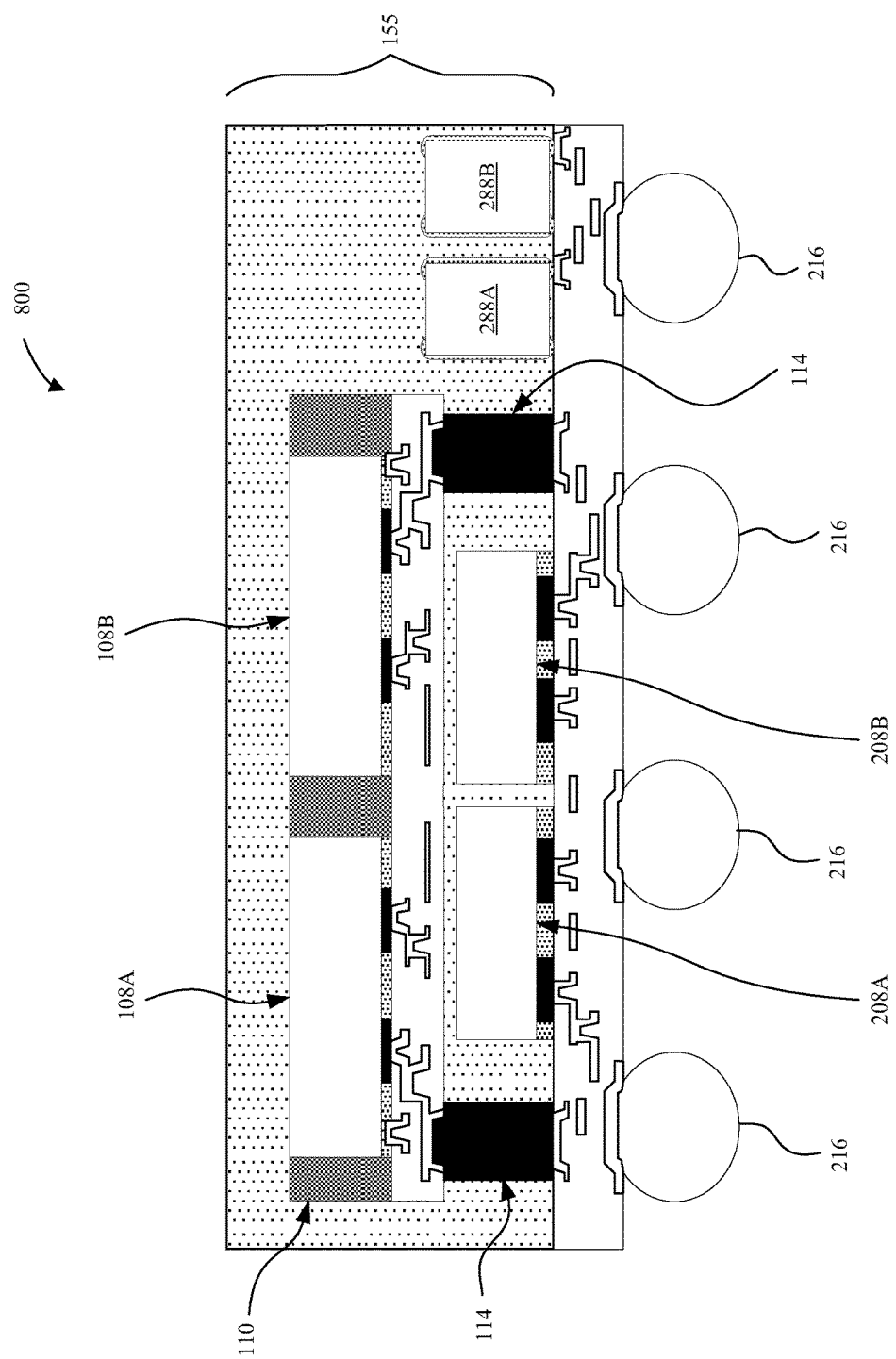
FIG. 8 is a cross-sectional side view illustration of a multiple component FOWLP in FOWLP that includes multiple passive elements in accordance an embodiment.

FIG. 8 is a cross-sectional side view illustration of a multiple component FOWLP in FOWLP structure 800 that includes at least one passive element in accordance an embodiment. The structure illustrated in FIG. 8 is substantially similar to that illustrated and described above with regard to FIG. 2K, with instead multiple die 108A, 108B on first routing layer 112, multiple die 208A, 208B on second routing layer 212, and multiple passive elements 288A, 288B on second routing layer 212. As described above in connection with FIG. 7, the multiple die/component configurations are not limited to the specific structure shown in FIG. 7, thus structure 800 is an example of a packaging configuration in accordance with the embodiments described herein that incorporates multiple die and components.

In utilizing the various aspects of the embodiments, it would become apparent to one skilled in the art that combinations or variations of the above embodiments are possible for forming a FOWLP. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
    a first routing layer including a first redistribution line;
    a first die including a first contact pad, wherein the first die is located on a top side of the first routing layer and the first redistribution line is formed directly on the first contact pad;
    a first molding compound encapsulating the first die on the first routing layer;
    a first plurality of conductive pillars extending from a bottom side of the first routing layer;
    a second routing layer, wherein the first plurality of conductive pillars is on a top side of the second routing layer;
    a second die on a top side of the second routing layer; and
    a second molding compound encapsulating the first molding compound, the first routing layer, the first plurality of conductive pillars, and the second die on the second routing layer.

2. The package of claim 1, wherein the first molding compound does not cover the top side of the first die.

3. The package of claim 1, wherein the second molding compound covers the top side of the first die.

4. The package of claim 1, wherein the first die is directly over the second die.

5. The package of claim 1, wherein the first plurality of conductive pillars is taller than the second die.

6. The package of claim 1, further comprising a plurality of first die on the top side of the first routing layer and encapsulated by the first molding compound.

7. The package of claim 1, further comprising a plurality of second die on the top side of the second routing layer and encapsulated by the second molding compound.

8. The package of claim 1, further comprising one or more passive elements encapsulated by the second molding compound.

9. The package of claim 1, further comprising conductive bumps on a bottom side of the second routing layer.

10. The package of claim 1, further comprising:
    a second plurality of conductive pillars extending from a bottom side of the second routing layer;
    a third routing layer, wherein the second plurality of conductive pillars is on a top side of the third routing layer; and
    a third die on the top side of the third routing layer.

11. The package of claim 10, further comprising a third molding compound encapsulating the second molding compound, the second routing layer, the second plurality of conductive pillars, and the third die on the third routing layer.

12. The package of claim 11, further comprising a plurality of conductive bumps on a bottom side of the third routing layer.

13. The package of claim 1, wherein the second molding compound laterally surrounds the first molding compound.

14. The package of claim 13, wherein the second molding compound laterally surrounds the first routing layer and the first plurality of conductive pillars.

15. The package of claim 1, wherein:
    the second die includes a second contact pad; and
    the second routing layer includes a second redistribution line formed directly on the second contact pad.

16. The package of claim 15, wherein the second molding compound laterally surrounds the first routing layer and the first plurality of conductive pillars.

17. The package of claim 1, wherein the second routing layer includes one or more second redistribution lines formed directly on a second contact pad of the second die and one or more of the first plurality of conductive pillars.

18. The package of claim 17, wherein the second molding compound laterally surrounds the first routing layer and the first plurality of conductive pillars.

19. The package of claim 17, wherein the first routing layer is less than 50 μm thick.

20. The package of claim 19, wherein the second routing layer is less than 50μm thick.

* * * * *